United States Patent
Yamashita et al.

(10) Patent No.: US 10,317,503 B2
(45) Date of Patent: Jun. 11, 2019

(54) TESTING DEVICE COMPRISING CIRCUITRY TO CALCULATE A CORRECTION VALUE FOR CALIBRATING CHANNEL LOSS

(71) Applicants: Koji Yamashita, Atsugi (JP); Hirofumi Kanno, Atsugi (JP); Toru Otani, Atsugi (JP); Shinichiro Oshima, Atsugi (JP)

(72) Inventors: Koji Yamashita, Atsugi (JP); Hirofumi Kanno, Atsugi (JP); Toru Otani, Atsugi (JP); Shinichiro Oshima, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 552 days.

(21) Appl. No.: 14/827,492

(22) Filed: Aug. 17, 2015

(65) Prior Publication Data

US 2016/0077158 A1 Mar. 17, 2016

(30) Foreign Application Priority Data

Sep. 17, 2014 (JP) .................. 2014-189022

(51) Int. Cl.
  *G01R 35/00* (2006.01)
  *G01R 31/319* (2006.01)
(52) U.S. Cl.
  CPC ......... *G01R 35/00* (2013.01); *G01R 31/3191* (2013.01)
(58) Field of Classification Search
  CPC ................ G01R 35/00; G01R 31/2601; G01R 31/2607; G01R 31/317; G01R 31/31905; G01R 31/3191
  See application file for complete search history.

(56) References Cited

U.S. PATENT DOCUMENTS

| 5,572,160 | A | * | 11/1996 | Wadell | ............... | G01R 31/3167 324/750.02 |
| 2005/0240852 | A1 | * | 10/2005 | Inaba | ................. | G01R 31/3167 714/740 |

(Continued)

FOREIGN PATENT DOCUMENTS

| CN | 101488813 A | 7/2009 |
| CN | 102255678 A | 11/2011 |

(Continued)

OTHER PUBLICATIONS

Office action issued by the State IP Office of People's Republic of China in corresponding Chinese Patent App. No. 201510594158.0, dated Jun. 9, 2017 (with translation).

*Primary Examiner* — Mushfique Siddique
(74) *Attorney, Agent, or Firm* — Greer Burns & Crain, Ltd.

(57) ABSTRACT

According to one embodiment, a testing device includes a signal generator that generates a first signal output to a device under test, a channel selector provided after the signal generator and configured to select one of a plurality of channels, a signal receiver that receives the second signal supplied from the device under test, a correction value calculator that calculates a correction value for calibrating loss of a respective one of the channels, wherein the correction value calculator calculates a correction value for calibrating loss of a respective one of the channels included in the channel selector, based on a signal level received by the signal receiver via a loopback channel, when a calibration-level output state indicating a state where a signal level of the first signal generated by the signal generator reaches a predetermined transmission reference level of calibration is assumed.

4 Claims, 15 Drawing Sheets

(56) References Cited

U.S. PATENT DOCUMENTS

2013/0122956 A1    5/2013  Lee et al.
2013/0250781 A1*   9/2013  Gilmartin ............... H04L 43/50
                                                        370/250

FOREIGN PATENT DOCUMENTS

JP        10-022889 A    1/1998
JP        2003-018104    1/2003

* cited by examiner

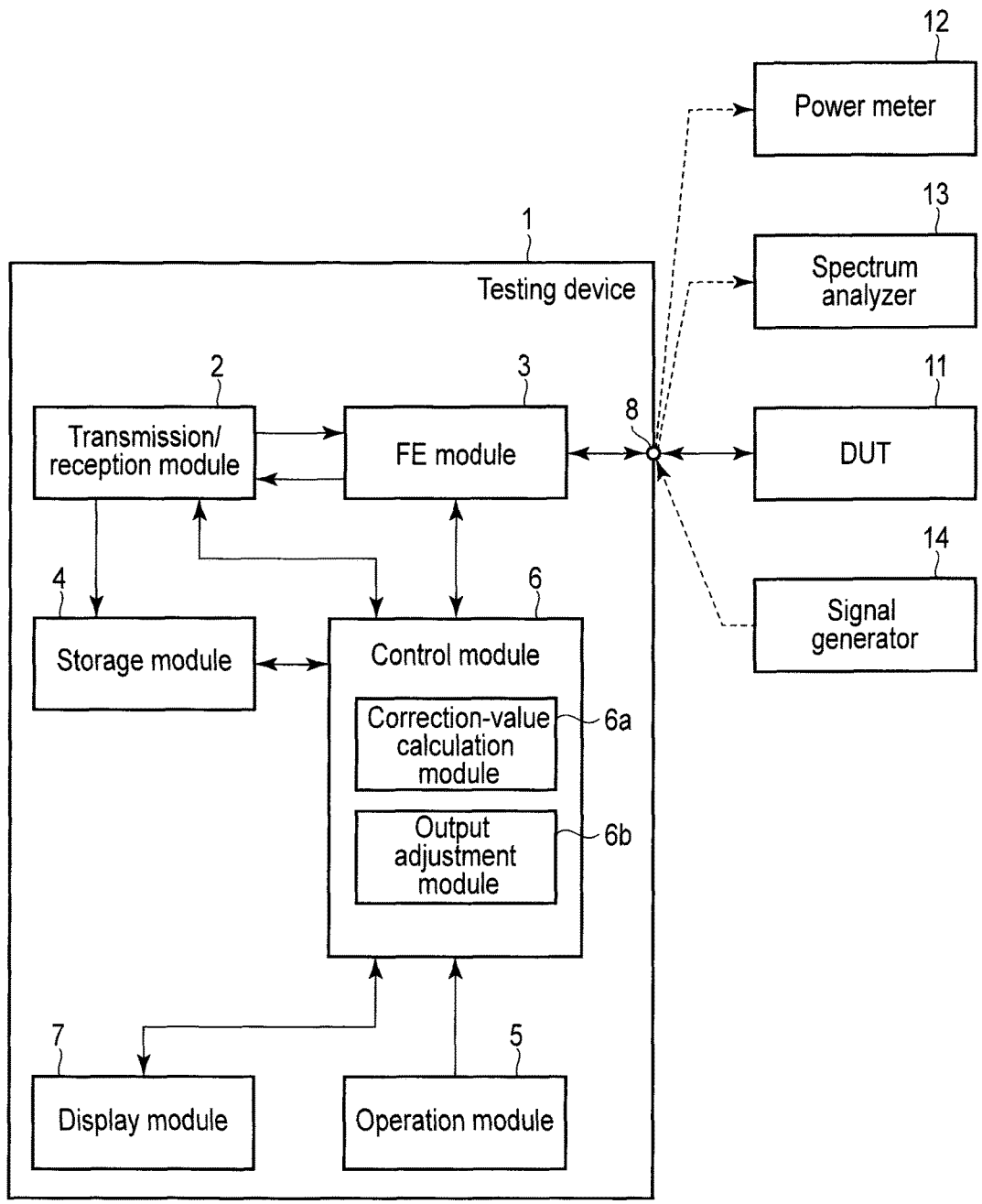
F I G. 1

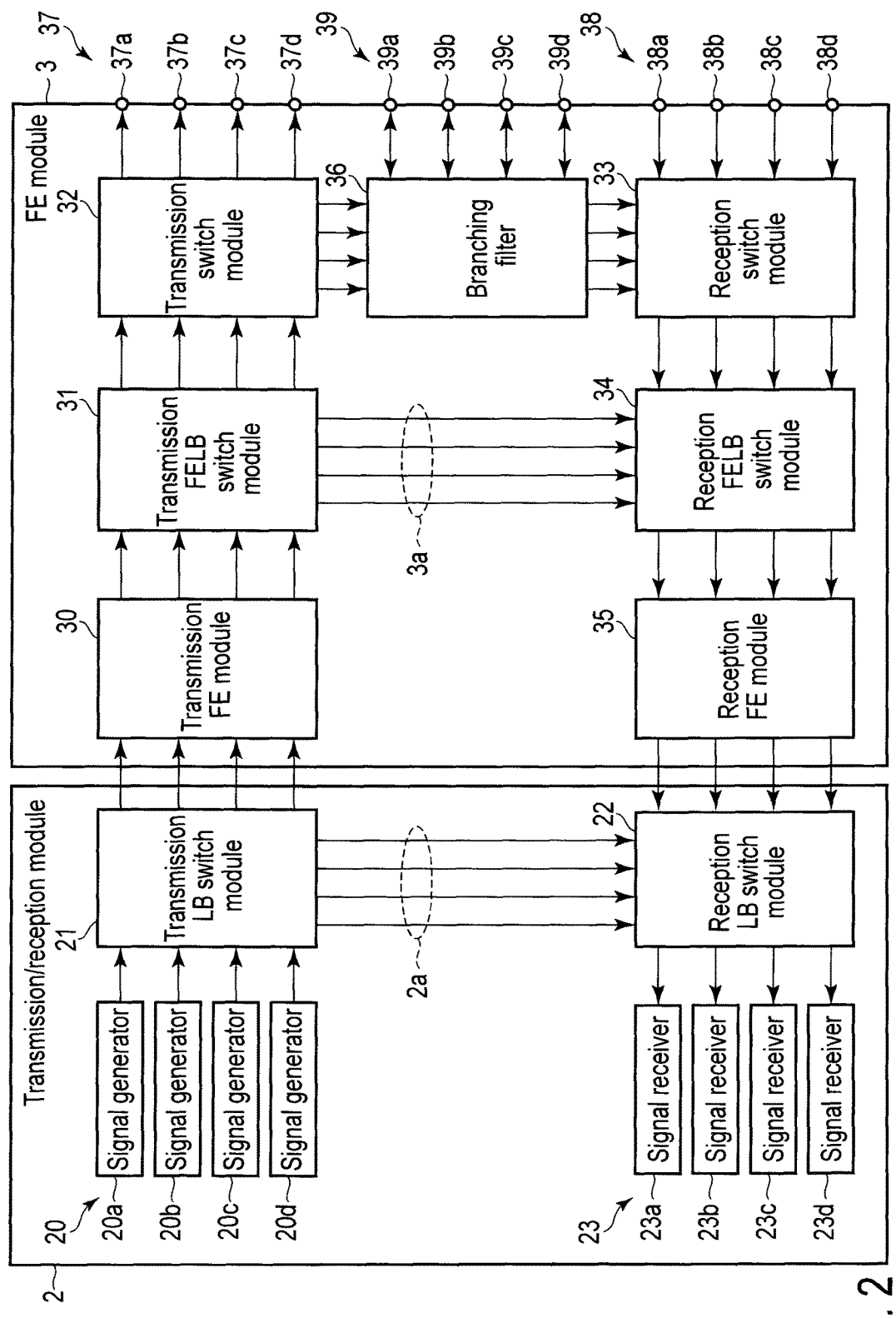
F I G. 2

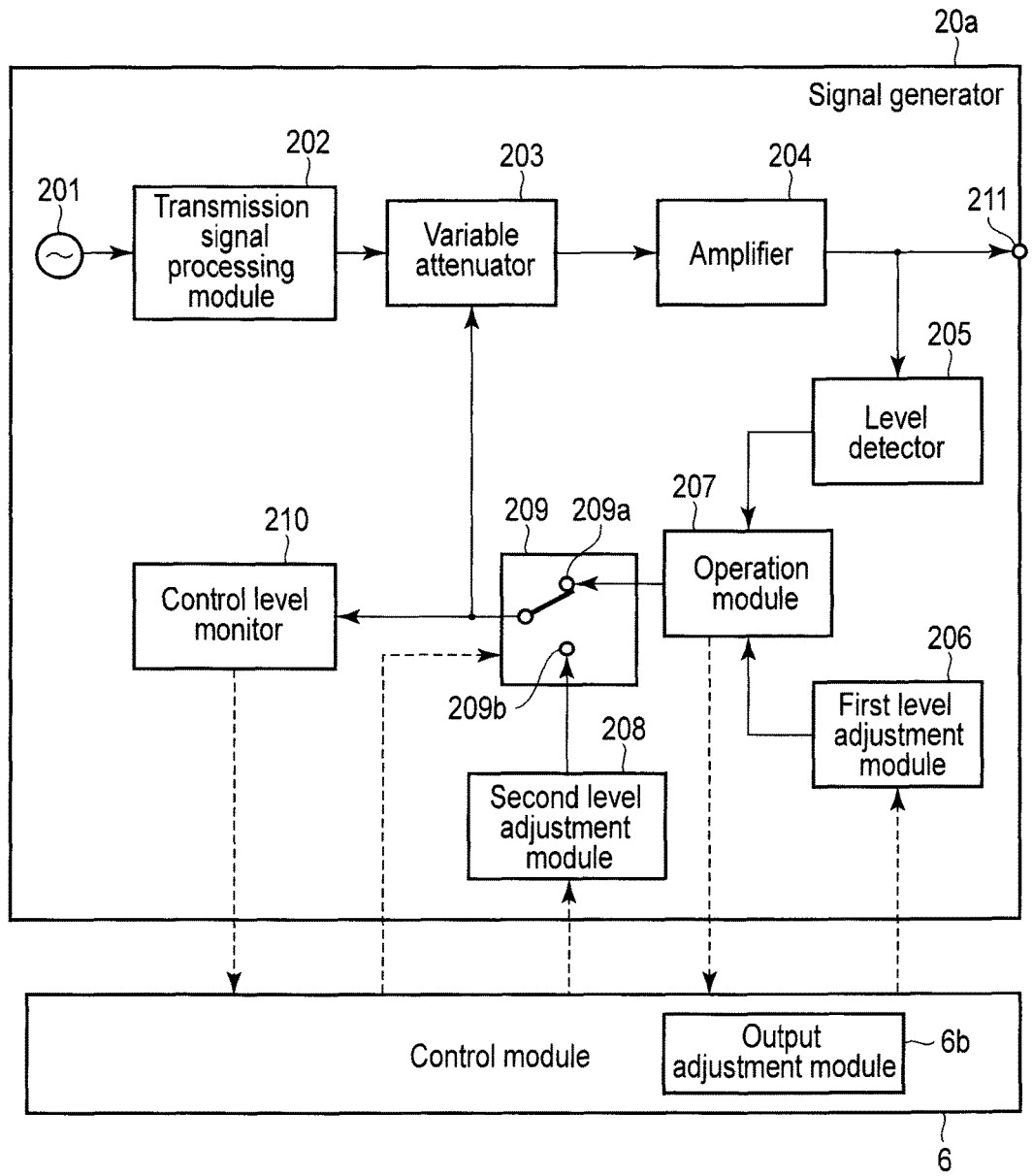
F I G. 3

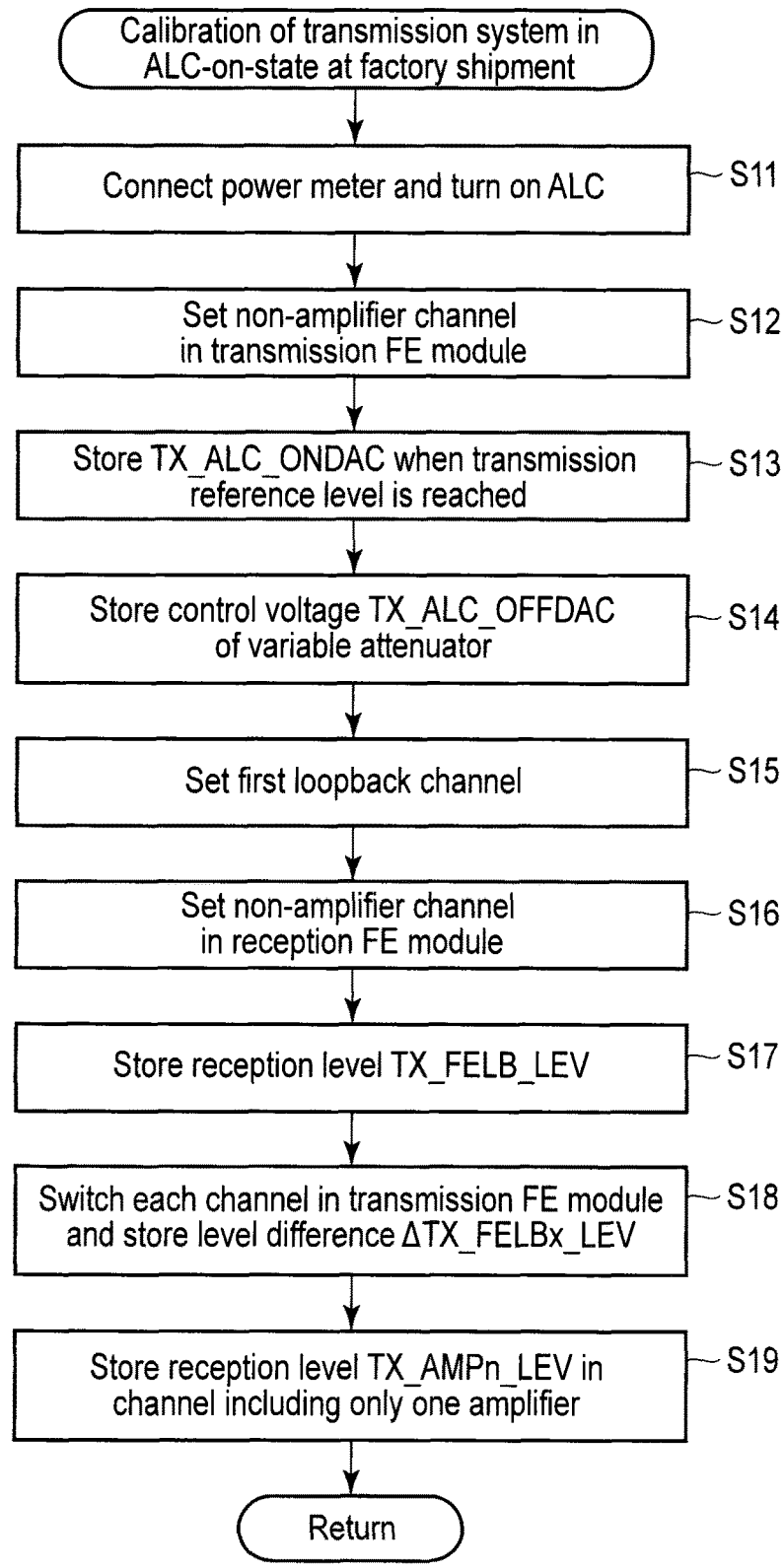
F I G. 7

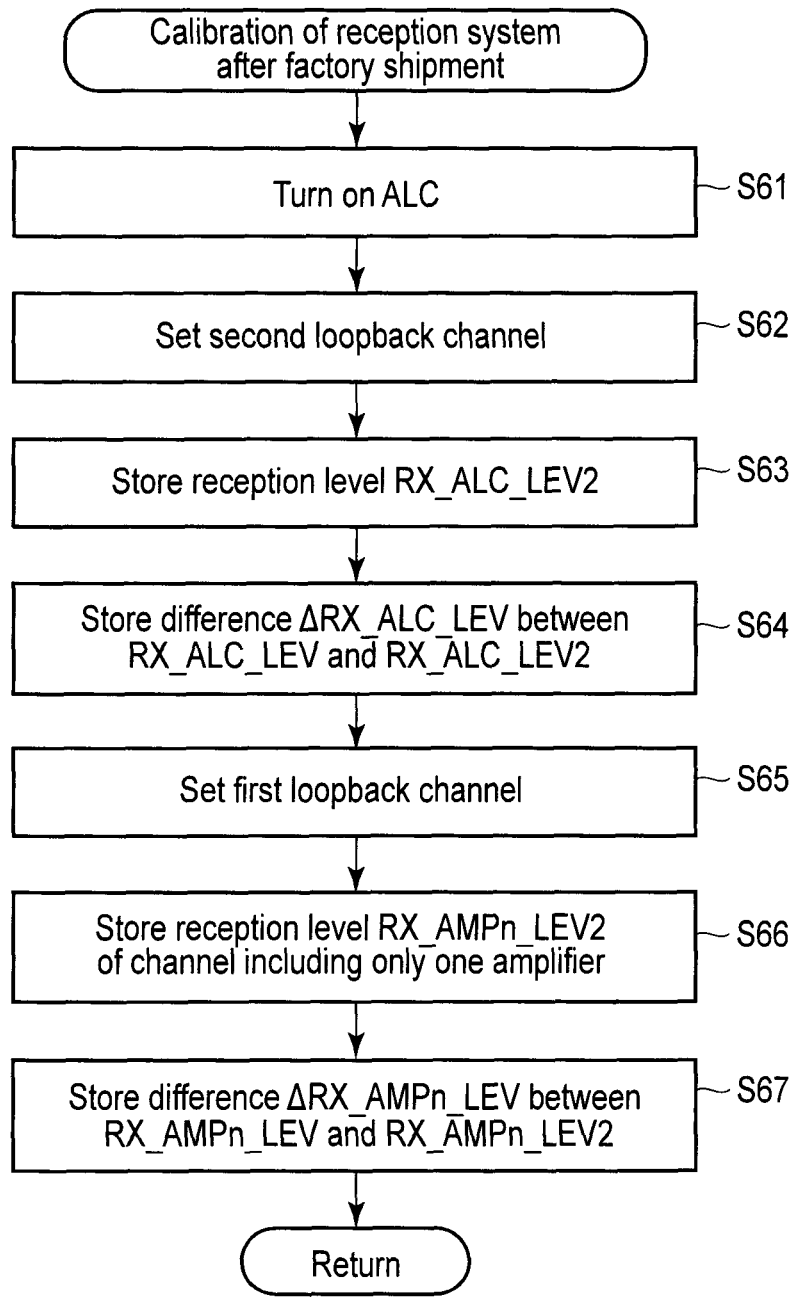
F I G. 12

TESTING DEVICE COMPRISING CIRCUITRY TO CALCULATE A CORRECTION VALUE FOR CALIBRATING CHANNEL LOSS

CROSS-REFERENCE TO RELATED APPLICATIONS

This application is based upon and claims the benefit of priority from prior Japanese Patent Application No. 2014-189022, filed Sep. 17, 2014, the entire contents of which are incorporated herein by reference.

BACKGROUND OF THE INVENTION

1. Field of the Invention

The present invention relates to a testing device for testing, for example, electrical characteristics of a portable device, and a calibration method employed therein.

2. Description of the Related Art

Conventionally, as this type of a testing device, a mobile-device testing system disclosed in, for example, patent document 1 (JP 2003-18104A), is known. The testing device described in patent document 1 comprises a signal generator for generating signals, an interface unit for switching the channel between the signal generator and a device as a measurement target, and a calibration power meter and a calibration receiver connected to the output side of the interface unit prior to testing in place of the measurement target device.

The conventional testing device constructed as the above measures, before execution of a test, the output of the interface unit channel by channel, using the calibration power meter and the calibration receiver, and pre-calculates calibration values associated with channel loss, thereby registering the values in a calibration table for correcting actual output signal levels.

By the way, in the conventional testing device, although calibration values can be relatively easily calculated if, for example, a measurement target device that has a single or a few antennas is tested, a great deal of time is required to test a recent technique, such as a carrier aggregation (CA) technique or a multiple-input multiple-output (MIMO) technique.

In the test of the CA or MIMO technique, a combining device for composing transmission signals and/or a distributor for distributing received signals is needed. The greater the number of combining devices or distributors, the greater the number of signal generators or the number of signal receivers.

The configuration of the interface unit on the transmission side for executing the test of the CA or MIMO technique are shown in FIGS. 13 to 15, assuming that the configuration of a conventional interface unit is used as a base. FIG. 13 is a view showing the configuration of an interface unit 110 that comprises signal generators 111a and 111b. FIG. 14 is a view showing the configuration of an interface unit 120 that comprises four signal generators 121a to 121d. FIG. 15 is a view showing the configuration of an interface unit 130 that comprises eight signal generators 131a to 131h. As is evident from FIGS. 13 to 15, the configuration of the interface unit becomes complex as the number of signal generators increases.

In FIGS. 13 to 15, interface units 110, 120 and 130 each comprise variable attenuators 112, switches SW 113, a combining device (or combining devices) 114 and an amplifier (or amplifiers) 115. Accordingly, if any of these configurations is adopted in the interface unit, significant signal level loss will occur, resulting in that the testing device does not satisfy test performance required by a device under test.

To overcome this problem, the following countermeasures may be taken:

(1) The signal generator is made to be able to output high power.

(2) The interface unit is made to comprise an amplifier.

(3) The interface unit is made to comprise an amplifier, and a level detector that enables the interface unit to perform auto level control (ALC), thereby enhancing the level accuracy of the output signal of the testing device.

Regarding item (1), the level loss of the interface unit can be compensated for if the signal generator outputs high power. However, the interface unit must have an amplifier excellent in linearity performance, which will raise problems, such as increases in required power and mounting area, and heat dissipation, resulting in an increase in device cost. Furthermore, the above-mentioned problem becomes more conspicuous in accordance with increases in the number of CAs or the number of MIMO antennas. In addition, since no consideration is given to a signal input to the testing device, there is a problem that the signal-to-noise ratio of the input signal will be degraded by a value corresponding to the level loss in the interface unit.

Regarding item (2), the level loss of the interface unit can be compensated for by an amplifier included in the interface unit. However, in general, there is a problem that the level accuracy of an output and an input will be degraded by fluctuation in gain due to fluctuation with time in the performance of the amplifier or due to fluctuation in temperature.

Regarding item (3), the level loss of the interface unit can be compensated for by the amplifier, and the level accuracy as the problem in item (2) can be solved by incorporating a level detector in the interface unit. In this case, however, the interface unit must comprise the level detector, which inevitably increases the device mounting area to thereby increase the device cost. This problem becomes serious in proportion to the number of signal generators.

As described above, in the conventional techniques, the time required for calibration cannot be shortened in testing, for example, the CA or MIMO technique, because a large number of signal generators and/or signal receivers are required to thereby make channels of transmitting signals complex.

BRIEF SUMMARY OF THE INVENTION

In view of the above, it is an object of the present invention to provide a testing device capable of achieving a short calibration time, and a calibration method employed therein.

In accordance with a first aspect, there is provided a testing device comprising:

a signal generator (20) configured to generate a first signal output to a device under test (11);

an output module (37) connected to the device under test (11);

a channel selector (30) provided between the signal generator (20) and the output module (37), and configured to select one of a plurality of channels;

an input module (38) configured to input a second signal supplied from the device under test (11);

a signal receiver (23) configured to receive the second signal;

an output-side loopback module (31) provided between the channel selector (30) and the output module (37), and connected to one of a loopback channel (3a) for looping back the first signal to the signal receiver side (23), and the output module (37);

an input-side loopback module (34) provided between the signal receiver (23) and the input module (38) and connected to one of the loopback channel and the input module (38); and a correction value calculator (6a) configured to calculate a correction value for calibrating loss of a respective one of the channels included in the channel selector (30);

wherein the channel selector (30) is enabled to select, between the input and output modules, one of at least one amplifier channel (30a, 30b) including one amplifier (305a, 305b) for amplifying the first signal, and at least one non-amplifier channel (30c) not including an amplifier; and the correction value calculator (6a) calculates a correction value for calibrating loss of a respective one of the channels included in the channel selector (30), based on a signal level received by the signal receiver (23) via the loopback channel (3a), when the channel selector (30) selects the non-amplifier channel (30c), and when a calibration-level output state indicating a state where a signal level, at the output module (37), of the first signal generated by the signal generator (20) reaches a predetermined transmission reference level of calibration.

By virtue of the above structure, in the testing device according to the first aspect of the invention, the correction value calculator calculates, in the calibration-level output state, a correction value for calibrating loss of a respective one of the channels included in the channel selector, based on a signal level received by the signal receiver via the loopback channel. This can shorten the time required for calibration.

In accordance with a second aspect, there is provided a testing device according to the first aspect of the invention and further comprising:

an input/output module (39) configured to receive the second signal from the device under test (11) and output the first signal to the device under test (11);

a branching module (36) connected to the input/output module (39) and configured to discriminate a signal received from the device under test (11) from a signal output to the device under test (11);

a first switching module (32) provided between the output-side loopback module (31) and the output module (37) and configured to output the first signal to one of the output module (37) and the branching module (36); and a second switching module (33) provided between the input-side loopback module (34) and the input module (38) and configured to receive the second signal from one of the input module (38) and the branching module (36).

By virtue of the above structure, in the testing device according to the second aspect of the invention, the time required for calibration can be shortened, regardless of whether the device under test is compliant with simplex communication or duplex communication.

In accordance with a third aspect, there is provided a testing device according to the first aspect of the invention and further characterized in that:

the signal generator comprises:

a signal generation source (201) configured to generate a signal;

a level variation module (203) configured to vary a level of the signal generated by the signal generation source (201);

a first output adjustment module (206) configured to output a first control signal to the level variation module (203) in accordance with an output level of the level variation module (203) to cause an output level of the signal generator (20) to reach a predetermined target level;

a second output adjustment module (6b) configured to output a second control signal to the first output adjustment module (206) to vary a level of the first control signal; and a storage module (4) configured to store a level of the second control signal in the calibration-level output state at factory shipment, wherein after the factory shipment, the second output adjustment module (6b) reads the level of the second control signal from the storage module (4), and sets the read level in the first output adjustment module (206).

By virtue of the above structure, in the testing device according to the third aspect of the invention, level fluctuation in the output of the signal generator due to aging or temperature fluctuation can be calibrated, whereby substantially the same signal level as at the factory shipment can be obtained.

In accordance with a fourth aspect, there is provided a testing device according to the first aspect of the invention and further characterized in that:

a transmission-side shipment-time signal level storage module (4) is further included;

at factory shipment in the calibration-level output state, the transmission-side shipment-time signal level storage module (4) stores a shipment-time signal level of the signal receiver (23) assumed when the channel selector (30) selects an amplifier channel including one amplifier; and after the factory shipment in the calibration-level output state, the correction value calculator (6a) acquires, as a correction value for calibrating level fluctuation in the amplifier channel (30a, 30b) including one amplifier (305), a difference between the shipment-time signal level and a post-shipment signal level of the signal receiver (23) assumed when the channel selector (30) selects the amplifier channel (30a, 30b) including one amplifier (305).

By virtue of the above structure, in the testing device according to the fourth aspect of the invention, level fluctuation in the output of the amplifier(s) of the channel selector due to aging or temperature fluctuation can be calibrated, whereby substantially the same signal level as at the factory shipment can be obtained.

In accordance with a fifth aspect, there is provided a testing device according to the first aspect of the invention and further characterized in that:

the channel selector (30) is used as a first channel selector (30);

there is also provided a second channel selector (35) provided between the signal receiver (23) and the input module (38) and configured to select one of at least one amplifier channel (35a, 35b) including one amplifier (353a, 353b) for amplifying the second signal, and at least one non-amplifier channel (35c) not including an amplifier;

in the calibration-level output state, the second channel selector (35) selects the at least one non-amplifier channel (35c), and the correction value calculator (6a) calculates the correction value for calibrating the loss of a respective one of the channels included in the second channel selector (35), based on a signal level received by the signal receiver (23) via the loopback channel (3a).

By virtue of the above structure, in the testing device according to the fifth aspect of the invention, in the calibration-level output state, the second channel selector selects a non-amplifier channel, and the correction value calculator calculates the correction value for calibrating the loss of a respective one of the channels included in the second channel selector, based on a signal level received by the signal receiver via the loopback channel, with the result that the time required for calibration can be shortened.

In accordance with a sixth aspect, there is provided a testing device according to the fifth aspect of the invention and further characterized in that:

the output-side loopback module (31), the input-side loopback module (34) and the loopback channel (3a) are used as a first output-side loopback module (31), a first input-side loopback module (34) and a first loopback channel (3a), respectively;

a second output-side loopback module (21) is further provided between the signal generator (20) and the first channel selector (30), and is connected to one of a second loopback channel (2a) for looping back the first signal to the signal receiver (23) side, and the first channel selector (30);

a second input-side loopback module (22) is further provided between the signal receiver (23) and the second channel selector (35), and is connected to one of the second loopback channel (2a) and the second channel selector (35); and a storage module (4) is further provided;

at factory shipment in the calibration-level output state, the storage module (4) stores a signal level received by the signal receiver (23) via the second loopback channel (2a);

after the factory shipment in the calibration-level output state, the correction value calculator (6a) acquires, as a correction value for calibrating level fluctuation in the signal generator (20), a difference between the signal level stored in the storage module (4) and a post-factory-shipment signal level received by the signal receiver (23) via the second loopback channel (2a).

By virtue of the above structure, in the testing device according to the sixth aspect of the invention, level fluctuation in the output of the signal generator due to aging or temperature fluctuation can be calibrated, whereby substantially the same signal level as at the factory shipment can be obtained.

In accordance with a seventh aspect, there is provided a testing device according to the fifth aspect of the invention and further characterized in that:

a reception-side shipment-time signal level storage module (4) is further included;

at factory shipment in the calibration-level output state, the reception-side shipment-time signal level storage module (4) stores a shipment-time signal level of the signal receiver (23) assumed when the second channel selector (35) selects the at least one amplifier channel (35a, 35b) including one amplifier (353); and after the factory shipment in the calibration-level output state, the correction value calculator (6a) acquires, as a correction value for calibrating level fluctuation in the at least one amplifier channel (35a, 35b) including one amplifier (353), a difference between a post-factory-shipment signal level assumed when the second channel selector (35) selects the at least one amplifier channel (35a, 35b) including one amplifier (353), and the shipment-time signal level.

By virtue of the above structure, in the testing device according to the seventh aspect of the invention, level fluctuation in the amplifier(s) of the second channel selector due to aging or temperature fluctuation can be calibrated, whereby substantially the same signal level as at the factory shipment can be obtained.

In accordance with an eighth aspect, there is provided a calibration method of calibrating the testing device of claim 1, comprising:

setting the non-amplifier channel (30c) in the channel selector (30) (S12);

setting the loopback channel (3a) between the output-side loopback module (31) and the input-side loopback module (34) (S15); and calculating, in the calibration-level output state, a correction value for calibrating loss of a respective one of the channels included in the channel selector (30), based on a signal level received by the signal receiver (23) via the loopback channel (3a) (S18).

Since the method of calibrating the testing device, according to the eighth aspect, includes a step of calculating, in the calibration-level output state, a correction value for calibrating loss of a respective one of the channels included in the channel selector, based on a signal level received by the signal receiver via the loopback channel, the time required for calibration can be shortened.

In accordance with a ninth aspect, there is provided a calibration method of calibrating the testing device of claim 5, comprising:

setting the non-amplifier channel (30c, 35c) in a respective one of the first and second channel selectors (30, 35) (S32);

setting the loopback channel (3a) between the output-side loopback module (31) and the input-side loopback module (34) (S35); and calculating, in the calibration-level output state, a correction value for calibrating loss of a respective one of the channels included in the second channel selector (35), based on a signal level received by the signal receiver (23) via the loopback channel (3a) (S37).

Since the method of calibrating the testing device, according to the ninth aspect, includes, in the calibration-level output state, steps of causing the second channel selector to select a non-amplifier channel, and calculating a correction value for calibrating loss of a respective one of the channels included in the second channel selector, based on a signal level received by the signal receiver via the loopback channel, the time required for calibration can be shortened.

BRIEF DESCRIPTION OF THE SEVERAL VIEWS OF THE DRAWING

FIG. 1 is a block diagram showing the configuration of a testing device according to an embodiment of the invention.

FIG. 2 is a block diagram showing the configuration of a transmission/reception module and an FE module in the testing device according to the embodiment.

FIG. 3 is a block diagram showing a signal generator in the testing device according to the embodiment.

FIG. 7 is a flowchart of calibration performed on a transmission system in the testing device of the embodiment at factory shipment when ALC is in the on-state.

FIG. 12 is a flowchart of calibration performed on the receiving system in the testing device of the embodiment after factory shipment.

DETAILED DESCRIPTION OF THE INVENTION

Figure 4:
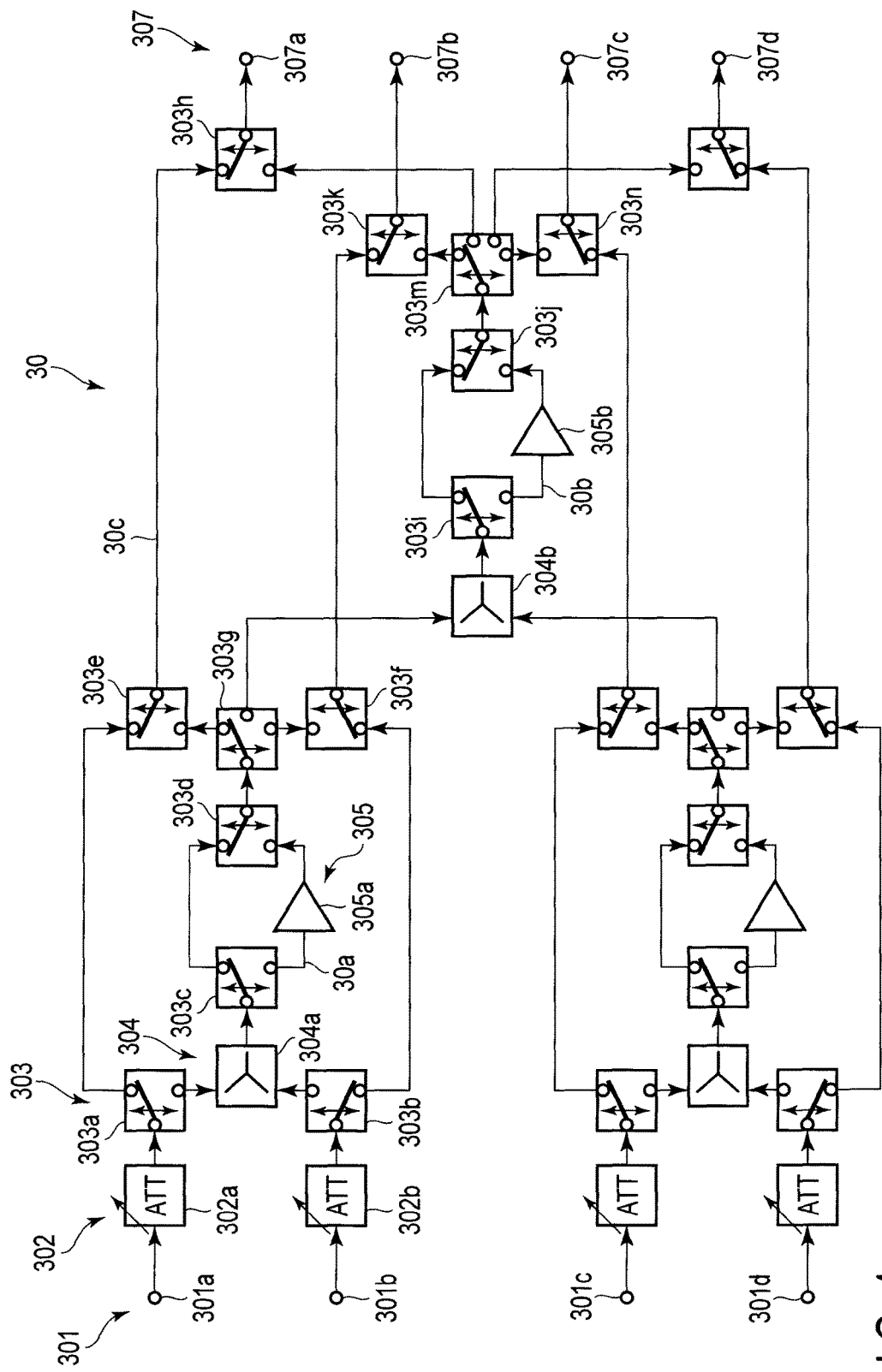
FIG. 4 is a block diagram showing a transmission FE module in the testing device according to the embodiment.

An embodiment of the invention will be described with reference to the accompanying drawings.

[Configuration of Testing Device]

Firstly, the configuration of a testing device according to the embodiment of the invention will be described.

As shown in FIG. 1, the testing device 1 of the embodiment comprises a transmission/reception module 2, a front end (FE) module 3, a storage module 4, an operation module 5, a control module 6, a display module 7, and input/output terminals 8. The testing device 1 tests a device under test (DUT) 11.

The testing device 1 also comprises a microcomputer. The microcomputer comprises, for example, a central processing module (CPU), a read only memory (ROM), a random access memory (RAM), an input/output circuit connected to various interfaces, which are not shown. The testing device 1 executes a control program pre-stored in the ROM, thereby causing the microcomputer to function as the transmission/reception module 2, the front end (FE) module 3, the storage module 4, the operation module 5, the control module 6 and the display module 7. The configurations of the transmission/reception module 2 and the FE module 3 will be described later.

The storage module 4 is formed of, for example, a hard disk drive. The storage module 4 stores each data item acquired by the transmission/reception module 2 during calibration. The storage module 4 constitutes storage means (storage module), transmission-side shipment-time signal level storage means (transmission-side shipment-time signal level storage module), and reception-side shipment-time signal level storage means (reception-side shipment-time signal level storage module).

The operation module 5 comprises an input device, such as a keyboard, a dial and/or a mouse, a display for displaying, for example, measurement conditions, a control circuit or software for controlling them, etc. A tester operates the operation module 5, for example, to input each test condition, to set display content of the display module 7, etc.

The control module 6 receives a signal from the operation module 5, and controls operations of the transmission/reception module 2, the FE module 3 and the storage module 4. Further, the control module 6 comprises a correction value calculator 6a as correction-value calculation means (correction value calculator) for calculating a correction value for calibration, and an output adjustment module 6b as output adjustment means (output adjustment module) for adjusting the output level of a first level-adjustment module 206, described later.

The display module 7 displays various data items at the time of calibration and testing in accordance with a control signal from the control module 6.

The input/output terminals 8 are connected, when necessary, to a power meter 12, a spectrum analyzer 13 and a signal generator 14, as well as the DUT 11.

In addition, the testing device 1 according to the invention may realize the functions by software using the microcomputer, may realize the functions by hardware, or may realize the functions utilizing both software and hardware.

[Configuration of Transmission/Reception Module 2]

Referring then to FIG. 2, a description will be given of the configuration of the transmission/reception module 2.

The transmission/reception module 2 comprises signal generators 20 (20a to 20d) as signal generating means (signal generators), a transmission loopback (LB) switching module 21 as second output-side loopback means (second output-side loopback module), a reception loopback (LB) switching module 22 as second input-side loopback means (second input-side loopback module), and signal receivers 23 (23a to 23d) as signal reception means (signal receivers). The transmission/reception module 2 further comprises loopback channels 2a between the transmission LB switching module 21 and the reception LB switching module 22. Although in the embodiment, four signal generators 20 and four signal receivers 23 are employed, the invention is not limited to this.

Signal generator 20a generates a predetermined signal (first signal) based on a control signal from the output adjustment module 6b of the control module 6. Since signal generators 20b to 20d have the same configuration as signal generator 20a, no description will be given thereof.

More specifically, as shown in FIG. 3, signal generator 20a comprises a signal generation source 201, a transmission-signal processing module 202, a variable attenuator 203 as level variable means (level variable module), an amplifier 204, a level detector 205, a first level-adjustment module 206 as first output control means (first output control module), an operation module 207, a second level-adjustment module 208, a switching module 209, a control level monitor 210, and an output terminal 211. Signal generator 20a cooperates with the control module 6 to realize an automatic level control (ALC) on-state where a radio-frequency (RF) signal output from the output terminal 211 is automatically controlled to a constant level, and an automatic level control (ALC) off-state where the RF signal is not automatically controlled to the constant level.

The signal generation source 201 generates a predetermined signal, based on data input by the tester by operating the operation module 5, and outputs the signal to the transmission-signal processing module 202.

The transmission-signal processing module 202 comprises, for example, a baseband modulator, an orthogonal modulator, etc., and generates an RF signal to be output to the DUT 11.

The variable attenuator 203 receives, in the ALC-on-state, a signal output as a control signal from the operation module 207, and receives, in the ALC-off-state, a signal output as a control signal from the second level-adjustment module 208, thereby varying the attenuation in accordance with the level (voltage) of the control signal.

The amplifier 204 amplifies the level of a signal output from the variable attenuator 203, and outputs the signal to the level detector 205 and the output terminal 211.

The level detector 205 comprises, for example, a wave detector, and detects the output of the amplifier 204, thereby outputting it to the operation module 207.

The first level-adjustment module 206 comprises, for example, a digital-to-analog converter (DAC), and outputs a signal that has a level based on a control signal of a digital value received from the output adjustment module 6b in the ALC-on-state.

The operation module 207 adds the output of the level detector 205 to the output of the first level-adjustment module 206, and outputs a signal indicating the addition result to the switching module 209 and the output adjustment module 6b. In the ALC-on-state, the output adjustment module 6b outputs a control signal according to the signal from the operation module 207, thereby increasing or decreasing the level of a signal output from the first level-adjustment module 206, to control the level of a signal output from the output terminal 211 to a target level.

The second level-adjustment module 208 comprises, for example, a DAC, and outputs a signal that has a level based on a control signal of a digital value received from the output adjustment module 6b in the ALC-off-state.

The switching module 209 has contacts 209a and 209b, and performs switching between the ALC-on-state and the ALC-off-state. The switching module 209 selects contact 209a in the ALC-on-state, and selects contact 209b in the off-state. As a result, the variable attenuator 203 has its attenuation controlled by the output signal of the operation module 207 in the ALC-on-state, and controlled by the output signal of the second level-adjustment module 208 in the ALC-off-state.

The control level monitor 210 comprises, for example, an analog-to-digital converter (ADC), monitors the level of a control signal input to the variable attenuator 203, and outputs a signal of a digital value, indicating of the level, to the output adjustment module 6b.

Returning to FIG. 2, description of the configuration of the transmission/reception module 2 will be continued.

The transmission LB switching module 21 relays signals from each signal generator 20 to the transmitting FE module 30 (described later) or the reception LB switching module 22 (via the loopback channels 2a) by switching a switch (not shown). The loopback channels 2a constitute second loopback channels.

The reception LB switching module 22 outputs signals from the transmission LB switching module 21 (via the loopback channels 2a) or the reception FE module 35 (described later) to the signal receivers 23 by switching a switch (not shown).

As described above, since the transmission/reception module 2 comprises the transmission LB switching module 21 and the reception LB switching module 22, signal receivers 23a to 23d can receive output signals of signal generators 20a to 20d via the respective loopback channels 2a by switching the respective internal switches of the switching modules 21 and 22.

The signal receivers 23 can measure the levels of RF signals received from the reception LB switching module 22. Further, the signal receivers 23 have, for example, orthogonal demodulators or baseband demodulators, and demodulate, into baseband signals, RF signals (second signals) received from the DUT 11.

[Configuration of FE Module 3]

The configuration of the FE module 3 will now be described. The FE module 3 comprises a transmission FE module 30, a transmission FELB (front end loopback) switching module 31, a transmission switching module 32 as first switch means (first switching module), a second reception switching module 33 as second switch means (second switching module), a reception FELB switching module 34, a reception FE module 35, a branching filter 36 as branching means (a branching module), output terminals 37 (37a to 37d) as output means (output module), input terminals 38 (38a to 38d) as input means (input module), and input/output terminals 39 (39a to 39d) as input/output means (input/output module). The FE module 3 further comprises loopback channels 3a between the transmission FELB switching module 31 and the reception FELB switching module 34.

The transmission FE module 30 has a configuration shown in, for example, FIG. 4. Namely, the transmission FE module 30 comprises input terminals 301 (301a to 301d), variable attenuators 302 (302a, 302b), switches (SW) 303 (303a to 303n), combining devices 304 (304a, 304b), amplifiers 305 (305a, 305b) and output terminals 307 (307a to 307d). The transmission FE module 30 constitutes channel selection means (channel selection module) and first channel selection means (first channel selection module).

Input terminals 301a to 301d receive signals from signal generators 20a to 20d through the transmission LB switching module 21, respectively.

Variable attenuators 302a and 302b attenuate the signal levels of the signals input to input terminals 301a and 301b, respectively.

SWs 303a to 303n switch channels, based on control signals from the control module 6. Data for setting all channels in the transmission FE module 30 is stored in the storage module 4. The control module reads the data to switch SWs 303a to 303n.

Combining device 304a combines signals, received by input terminals 301a and 301b, through a combination of variable attenuator 302a and SW 303a, and a combination of variable attenuator 302b and SW 303b. Combining device 304a is used to test a DUT corresponding to, for example, carrier aggregation (CA) in Long Term Evolution (LTE) Advanced communication standards. The same can be said of combining device 304b.

Amplifiers 305a and 305b amplify input signals with a predetermined amplification factor.

As shown in FIG. 4, the transmission FE module 30 has at least one amplifier channel including an amplifier, and at least one non-amplifier channel not including an amplifier, and is configured to select one of these channels by switching the SWs 303.

An amplifier channel including one amplifier is, for example, a channel (amplifier channel 30a) formed of input terminal 301a, variable attenuator 302a, SW 303a, combining device 304a, SW 303c, amplifier 305a, SW 303d, SW 303g, SW 303e, SW 303h and output terminal 307a.

An amplifier channel including two amplifiers is, for example, a channel (amplifier channel 30b) that is obtained by switching SW 303g of the above-mentioned amplifier channel including one amplifier, to thereby include SW 303g, combining device 304b, SW 303i, amplifier 305b, SW 303j, SW 303m, SW 303h and output terminal 307a.

A non-amplifier channel not including an amplifier is, for example, a channel (non-amplifier channel 30c) formed of input terminal 301a, variable attenuator 302a, SW 303a, SW 303e, SW 303h, output terminal 307a.

In addition, referring to FIG. 4, it is evident that an amplifier channel including one or two amplifiers, and a non-amplifier channel can be set, by switching the SWs 303, between input terminal 301b and output terminals 307b, between input terminal 301c and output terminal 307c, and between input terminal 301d and output terminal 307d (description thereof is omitted).

Returning to FIG. 2, the transmission FELB switching module 31 relays signals from the transmission FE module 30 to the transmission switching module 32 or to the reception FELB switching module 34 (via loopback channel 3a) by switching a switch (not shown). The transmission FELB switching module 31 constitutes output-side loopback means (output-side loopback module) and first output-side loopback means (first output-side loopback module). Further, loopback channels 3a constitute first loopback channels.

The transmission switching module 32 relays signals from the transmission FELB switching module 31 to the output terminals 37 or to the branching filter 36 by switching a switch (not shown). More specifically, if the DUT 11 is a model corresponding to simplex communication (one-way communication), the transmission switching module 32 relays signals from the transmission FELB switching module 31 to the output terminals 37, and if the DUT 11 is a model corresponding to duplex communication (two-way communication), the transmission switching module 32 relays signals from the transmission FELB switching module 31 to the input/output terminals 39 via the branching filter 36.

The reception switching module 33 relays signals from the branching filter 36 or from the input terminals 38 to the reception FELB switching module 34 by switching a switch (not shown). More specifically, if the DUT 11 is a model corresponding to simplex communication, the reception switching module 33 relays signals from the input terminals 38 to the reception FELB switching module 34, and if the DUT 11 is a model corresponding to duplex communication (two-way communication), the reception switching module 33 relays signals from the input/output terminals 39 to the reception FELB switching module 34 via the branching filter 36.

The reception FELB switching module 34 relays signals from the transmission FELB switching module 31 (via loopback channels 3a) or from the reception switching module 33 to the reception FE module 35 by switching a switch (not shown). This reception FELB switching module 34 constitutes input-side loopback means (input-side loopback module) and first input-side loopback means (first input-side loopback module).

Figure 5:
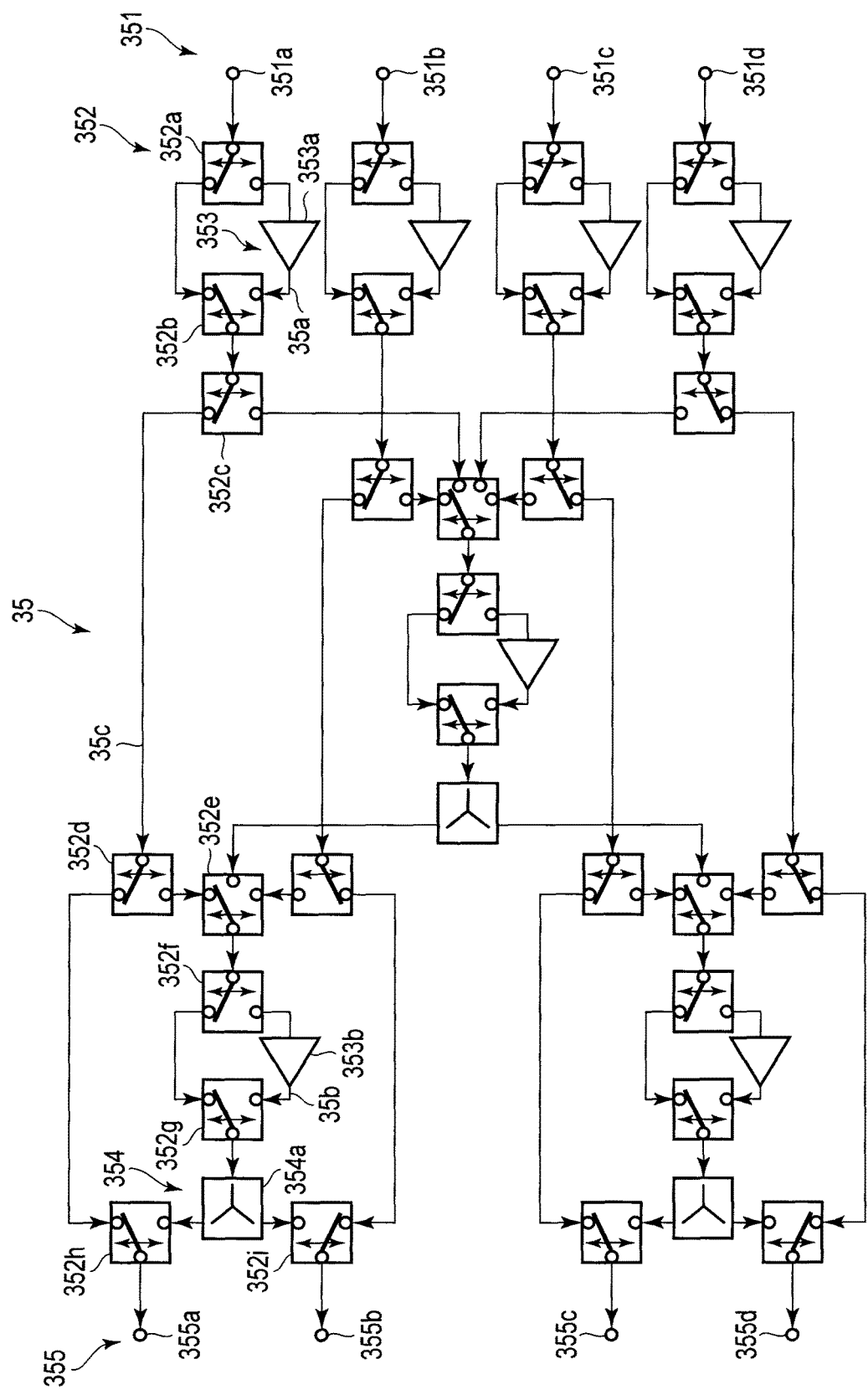
FIG. 5 is a block diagram showing a reception FE module in the testing device according to the embodiment.

The reception FE module 35 has a configuration as shown in FIG. 5, for example. That is, the reception FE module 35 comprises input terminals 351 (351a to 351d), switches (SWs) 352 (352a to 352i), amplifiers 353 (353a, 353b), distributors 354 (354a), and output terminals 355 (355a to 355d). The reception FE module 35 constitutes second channel selection means (second channel selection module).

Input terminals 351a to 351d receive signals from generators 20a to 20d or signals from input terminals 38a to 38d, respectively.

SWs 352a to 352i switch the channels based on control signals from the control module 6. Data for setting all channels in the reception FE module 35 is stored in the storage module 4, and is read by the control module 6 to switch SWs 352a to 352i.

Distributor 354a distributes an input signal to two elements. Distributor 354a is used to test a DUT corresponding to, for example, carrier aggregation in communication standards LTE-Advanced.

Amplifiers 353a and 353b amplify input signals with a predetermined amplification factor.

As shown in FIG. 5, the reception FE module 35 has at least one amplifier channel including an amplifier, and at least one non-amplifier channel not including an amplifier, and is configured to select one of these channels by switching the SWs 352.

An amplifier channel including one amplifier is, for example, a channel (amplifier channel 35a) formed of input terminal 351a, amplifier 353a, SW 352b, SW 352c, SW 352d, SW 352h and output terminal 355a.

An amplifier channel including two amplifiers is, for example, a channel (amplifier channel 35b) that is obtained by switching SW 352d of the above-mentioned amplifier channel including one amplifier, to thereby include SW 352d, SW 352e, SW 352f, amplifier 353b, SW 352g, distributor 354a, SW 352h and output terminal 355a.

A non-amplifier channel not including an amplifier is, for example, a channel (non-amplifier channel 35c) formed of input terminal 351a, SW 352a, SW 352b, SW 352c, SW 352d, SW 352h and output terminal 355a.

In addition, referring to FIG. 5, it is evident that an amplifier channel including one or two amplifiers, and a non-amplifier channel can be set, by switching the SWs 352, between input terminal 351b and output terminals 355b, between input terminal 351c and output terminal 355c, and between input terminal 351d and output terminal 355d (description thereof is omitted).

Returning to FIG. 2, the branching filter 36 is used when the DUT 11 is a model corresponding to duplex communication. The branching filter 36 is connected to the input/output terminals 39, and branches a signal received from the DUT 11, and a signal output to the DUT 11.

The output terminals 37, the input terminals 38, or the input/output terminals 39 are connected to the input/output terminals 8 by switching control of the control module 6 (see FIG. 1).

Although FIG. 2 shows a configuration where the transmission/reception module 2 is separate from the transmission FE module 3, these modules may be integrated as one body.

[Operation of Testing Device 1]

Referring then to FIGS. 6 to 12, a description will be given of the operation of the testing device 1 in the embodiment. In the description below, loopback channels 3a are referred to as first loopback channels 3a, and loopback channels 2a will be referred to as second loopback channels 2a.

[Calibration of Testing Device 1 at Factory Shipment]

Figure 6:
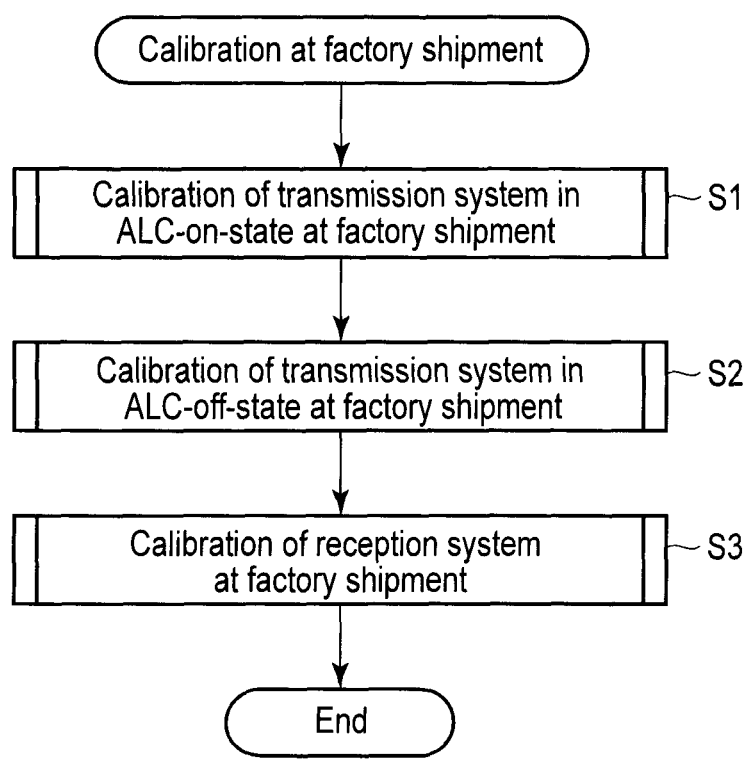
FIG. 6 is a main flowchart of calibration performed on the testing device of the embodiment at factory shipment.

FIG. 6 is a main flowchart showing calibration of the testing device 1 at factory shipment. As shown in FIG. 6, for the testing device 1, calibration at factory shipment is executed on the transmission system of the testing device 1 in an ALC-on-state (step S1) and in an ALC-off-state (step S2), and calibration at factory shipment is executed on the receiving system of the testing device 1 (step S3).

[Calibration of Transmission System at Factory Shipment]

FIG. 7 is a flowchart of calibration performed, in step Si of FIG. 6, on the transmission system at factory shipment when ALC is in the on-state. In an initial state, the transmission LB switching module 21 is connected to the transmission FE module 30, the transmission FELB switching module 31 is connected to the transmission switching module 32, and the transmission switching module 32 is connected to the output terminals 37.

The power meter 12 is connected to the input/output terminals 8 of the testing device 1, and the control module 6 causes the switching module 209 to select contact 209a to thereby set the ALC-on-state (step S11).

The control module 6 sets the transmission FE module 30 to have a non-amplifier channel not including an amplifier (step S12). More specifically, in FIG. 4, in, for example, a channel for transmitting the output signal of signal generator 20a, the control module 6 switches corresponding SWs to form the non-amplifier channel 30c comprising input terminal 301a, variable attenuator 302a, SW 303a, SW 303e, SW 303h and output terminal 307a. Signal generators 20b to 20d are set in the same way as in signal generator 20a.

The control module 6 causes the signal generation source 201 of each signal generator 20 to generate a signal, and repeatedly controls the attenuation of the variable attenuator 203 via the first level-adjustment module 206 so that the measurement level of a corresponding output terminal 37 will be adjusted to a predetermined transmission reference level (TX_BASE_LEV) of calibration. A state, in which the measurement level of the output terminal 37 reaches the transmission reference level (TX_BASE_LEV) of calibration, is a calibration-level output state according to the invention.

The control module 6 stores, in the storage module 4, a set value (TX_ALC_ONDAC) for the first level-adjustment module 206, which is set when the measurement level of the output terminal 37 reaches the transmission reference level (TX_BASE_LEV) of calibration (step S13).

The control level monitor 210 reads the control level of the variable attenuator 203 obtained when the measurement level of the output terminal 37 reaches the transmission reference level (TX_BASE_LEV) of calibration, and sends the read data to the control module 6. The control module 6 stores, in the storage module 4, the control level (TX_ALC_OFFDAC) of the variable attenuator 203 at that time (step S14). Steps S15 to S19 below indicate processing performed, using the output of the signal generator 20, in a state where the measurement level of the output terminal 37 reaches the transmission reference level (TX_BASE_LEV) of calibration.

The control module 6 switches each SW (switch) included in the transmission FELB switching module 31 and the reception FELB switching module 34, to set first loopback channels 3a so that the output side of the transmission FELB switching module 31 will be the reception FELB switching module 34, and the input side of the reception FELB switching module 34 will be the transmission FELB switching module 31 (step S15).

The control module 6 sets the reception FE module 35 to have a non-amplifier channel not including an amplifier (step S16). More specifically, in FIG. 5, in, for example, a channel for transmitting the output signal of signal generator 20a, the control module 6 switches corresponding SWs to form the non-amplifier channel 35c comprising input terminal 351a, SW 352a, SW 352b, SW 352c, SW 352d, SW 352h and output terminal 355a. Channels associated with signal generators 20b to 20d are set in the same way as in signal generator 20a.

A signal reception module 23 measures a reception level (TX_FELB_LEV) in the non-amplifier channel set in step S16. The control module 6 stores the reception level (TX_FELB_LEV) in the storage module 4 (step S17).

The control module 6 appropriately switches SWs included in the transmission FE module 30, and the signal reception module 23 measures a reception level in each channel of the transmission FE module 30, whereby a measurement level difference (ΔTX_FELBx_LEV) between the reception level of each channel and the above-mentioned reception level (TX_FELB_LEV) is calculated. x indicates a preset identification number allocated to each channel. If there are k channels, x=1 to k. The control module 6 stores the measurement level difference (ΔTX_FELBx_LEV) in the 30 storage module 4 (step S18). If each channel of the transmission FE module 30 is corrected using the stored the measurement level difference (ΔTX_FELBx_LEV), this is calibration at the input/output terminals 8 of the testing device 1. Namely, the measurement level difference (ΔTX_FELBx_LEV) is a correction value for calibrating each loss difference between the channels of the transmission FE module 30.

The control module 6 appropriately switches each SW included in the transmission FE module 30, thereby sequentially setting amplifier channels each including only one amplifier 305. Specifically, in FIG. 4, the control module 6 switches corresponding SWs to form, for example, amplifier channel 30a formed of input terminal 301a, variable attenuator 302a, SW 303a, combining device 304a, SW 303c, amplifier 305a, SW 303d, SW 303g, SW 303e, SW 303h and output terminal 307a.

The signal reception module 23 sequentially measures reception levels (TX_AMPn_LEV) of amplifier channels including only one amplifier 305. n indicates an identification number beforehand allocated to a respective amplifier. In the case shown in FIG. 4, since three amplifiers are employed, n=1 to 3. The control module 6 stores the reception level (TX_AMPn_LEV) in the storage module 4 (step S19). The stored reception level (TX_AMPn_LEV) serves as a reference value to be referred to when correcting level fluctuation in the amplifier 305 due to aging and temperature fluctuation.

Figure 8:
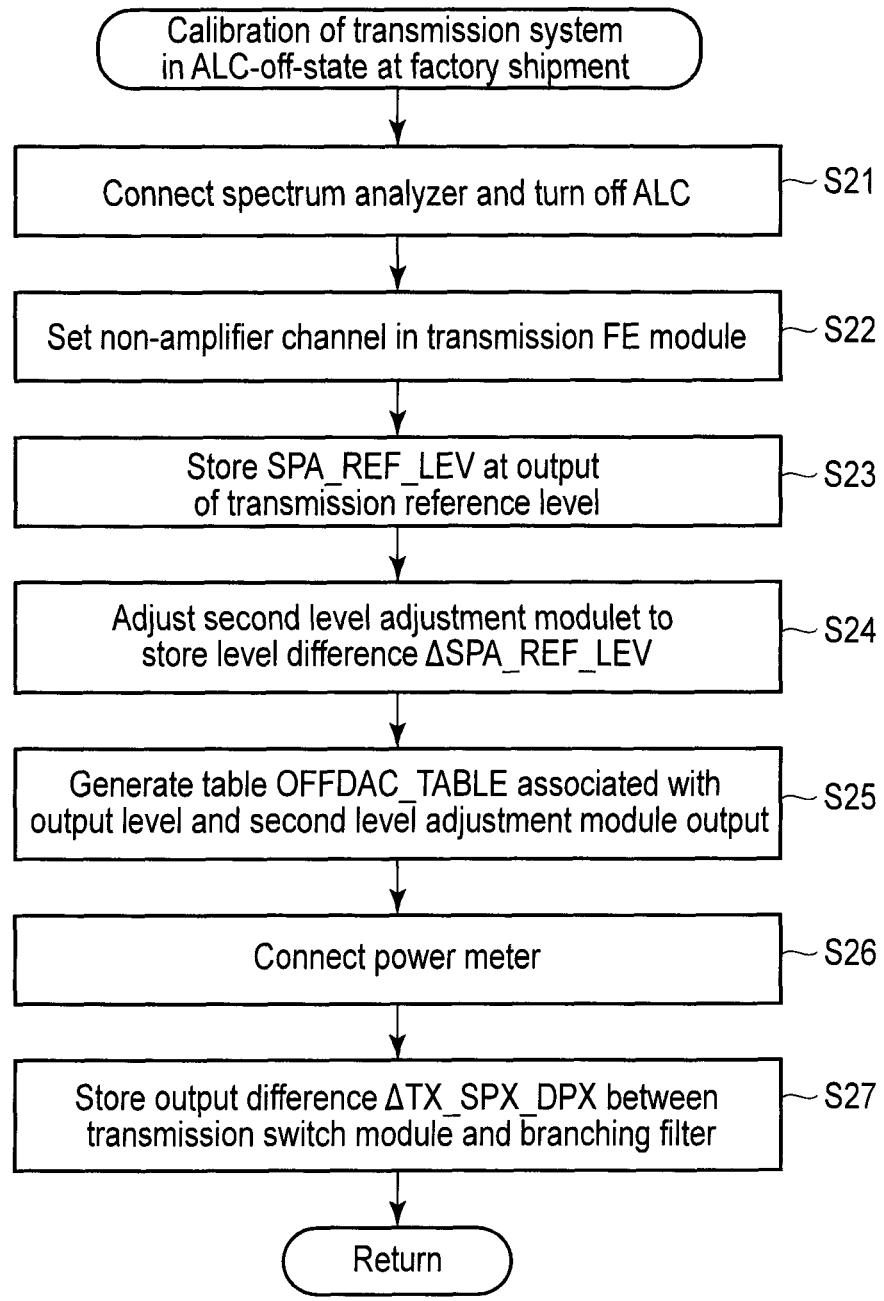
FIG. 8 is a flowchart of calibration performed on the transmission system in the testing device of the embodiment at factory shipment when the ALC is in the off-state.

FIG. 8 is a flowchart of calibration performed on the transmission system in step S2 of FIG. 6 at factory shipment when the ALC is in the off-state.

The spectrum analyzer 13 is connected to the input/output terminals 8 of the testing device 1. The control module 6 causes the switching module 209 to select contact 209b, thereby turning off the ALC (step S21).

The control module 6 sets the transmission FE module 30 to have a non-amplifier channel not including an amplifier (step S22).

The control module 6 measures the measurement level (SPA_REF_LEV) of the spectrum analyzer 13 when the measurement level of the output terminal 37 is equal to transmission reference level (TX_BASE_LEV) of calibration (step S23).

The control module 6 calculates the level difference (ΔSPA_REF_LEV) between the measurement level (SPA_REF_LEV) and each of the measurement levels of the output terminal 37, and stores the calculated level differences in the storage module 4 (step S24). The measurement levels of the output terminal 37 are obtained when the control module 6 outputs a control signal to the second level-adjustment module 208 while varying the level of the control signal. The control signal is used to operate the second level-adjustment module 208 from the lower limit to the upper limit of the adjustable range thereof on a basis of a predetermined number of bits. The predetermined number of bits may be, for example, one bit or 10 bits. In the case of 10 bits, a result on a one-bit basis may be obtained by performing measurement 10 bits by 10 bits and then interpolating measurement levels resulting therefrom.

Using the measurement data obtained in step S24, the control module 6 generates a table (OFFDAC_TABLE (TX_ALC_OFFDAC, Δoutput level)) indicating changes in the level of the control signal output to the second level-adjustment module 208 and associated with changes (Δoutput level) in the output level of the output terminal 37 (step S25).

The power meter 12 is connected to the input/output terminals 8 of the testing device 1, in place of the spectrum analyzer 13 (step S26).

The control module 6 sets the transmission FE module 30 to have a non-amplifier channel not including an amplifier. Subsequently, the control module 6 sets SWs in the transmission switching module 32 so that the signals of the transmission switching module 32 will be output to the output terminals 37, and measures a signal level (TX_SPX) at one of the input/output terminals 8, using the power meter 12.

The control module 6 sets SWs in the transmission switching module 32 so that the signals of the transmission switching module 32 will be output to the branching filter 36. The control module 6 measures the level (TX_DPX) of a signal output from one of the input/output terminals 8 via a corresponding one of the input/output terminals 39, using the power meter 12.

The control module 6 calculates the level differences (ΔTX_SPX_DPX) of corresponding signal levels (TX_SPX) and (TX_DPX), and stores the calculated differences in the storage module 4 (step S27).

[Calibration of Receiving System at Factory Shipment]

Figure 9:
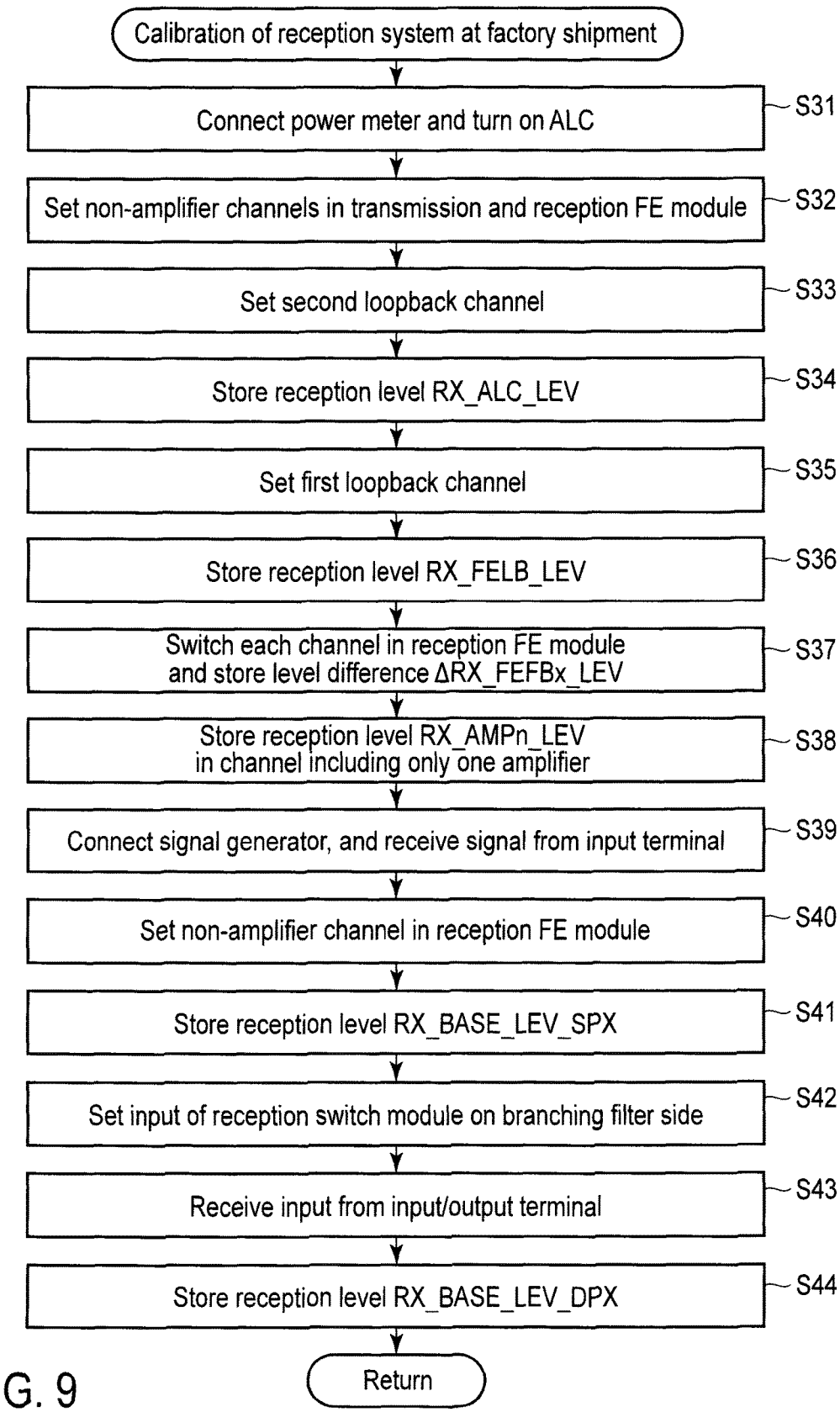
FIG. 9 is a flowchart of calibration performed on a receiving system in the testing device of the embodiment at factory shipment.

FIG. 9 is a flowchart of calibration performed, in step S3 of FIG. 6, on the receiving system at factory shipment. In an initial state, the reception LB switching module 22 is connected to the reception FE module 35, the reception FELB switching module 34 is connected to the reception switching module 33, and the reception switching module 33 is connected to the input terminals 38.

The power meter 12 is connected to the input/output terminals 8 of the testing device 1, and the control module 6 causes the switching module 209 to select contact 209*a* to thereby set the ALC-on-state (step S31).

The control module 6 sets the transmission FE module 30 and the reception FE module 35 to each have a non-amplifier channel not including an amplifier (step S32).

The control module 6 causes the signal generation source 201 of each signal generator 20 to generate a signal, and repeatedly controls the attenuation of the variable attenuator 203 via the first level-adjustment module 206 so that the measurement level of a corresponding output terminal 37 will be adjusted to a predetermined transmission reference level (TX_BASE_LEV) of calibration.

The control module 6 switches each SW, included in the transmission LB switching module 21 and the reception LB switching module 22, to set second loopback channels 2*a* so that the output side of the transmission LB switching module 21 will be the reception LB switching module 22, and the input side of the reception LB switching module 22 will be the transmission LB switching module 21 (step S33).

The signal reception module 23 measures a reception level (RX_ALC_LEV) in the above channel structure. The control module 6 stores the reception level (RX_ALC_LEV) in the storage module 4 (step S34).

The control module 6 cancels the setting of second loopback channels 2*a*, and sets first loopback channels 3*a* (step S35). Namely, the control module 6 cancels the setting of second loopback channels 2*a* by switching each SW, included in the transmission LB switching module 21 and the reception LB switching module 22, so that the output side of the transmission LB switching module 21 will be the transmission FE module 30, and the input side of the reception LB switching module 22 will be the reception FE module 35. Further, the control module 6 sets first loopback channels 3*a* by switching each SW, included in the transmission FELB switching module 31 and the reception FELB switching module 34, so that the output side of the transmission FELB switching module 31 will be the reception FELB switching module 34, and the input side of the reception FELB switching module 34 will be the transmission FELB switching module 31.

The signal reception module 23 measures a reception level (RX_FELB_LEV) in the above channel structure. The control module 6 stores the reception level (RX_FELB_LEV) in the storage module 4 (step S36).

The control module 6 appropriately switches each SW included in the reception FE module 35, and the signal reception module 23 measures the reception level of each channel of the reception FE module 35. The control module 6 calculates the measurement level difference (ΔRX_FELBx_LEV) between the reception level of each channel and the reception level (RX_FELB_LEV).

x indicates a preset identification number allocated to each channel. If there are k channels, x=1 to k. The control module 6 stores the measurement level difference (ΔRX_FELBx_LEV) in the storage module 4 (step S37).

The signal reception module 23 sequentially measures reception levels (RX_AMPn_LEV) of amplifier channels including only one amplifier 353. n indicates an identification number beforehand allocated to a respective amplifier. In the case shown in FIG. 5, since seven amplifiers are employed, n=1 to 7. The control module 6 stores the reception level (RX_AMPn_LEV) in the storage module 4 (step S38).

The signal generator 14 is connected to the input/output terminals 8 of the testing device 1, and the control module 6 connects the input/output terminals 8 to the input terminals 38, thereby setting a state for receiving signals from the input terminals (step S39). The output level of the signal generator 14 is assumed to be an output level (RX_BASE_LEV).

The control module 6 sets the reception FE module 35 to have a non-amplifier channel not including an amplifier (step S40).

The signal reception module 23 measures a reception level (RX_BASE_LEV_SPX) in the above channel structure. The control module 6 stores the reception level (RX_BASE_LEV_SPX) in the storage module 4 (step S41).

The control module 6 sets each SW in the reception switching module 33 so that the input side of the reception switching module 33 will be the branching filter 36 (step S42), thereby enabling signals to be received from the signal generator 14 via the input/output terminals 8 (step S43).

The signal reception module 23 measures a reception level (RX_BASE_LEV_DPX) in the above channel structure. The control module 6 stores the reception level (RX_BASE_LEV_DPX) in the storage module 4 (step S44).

[Calibration of Testing Device 1 After Factory Shipment]

Figure 10:
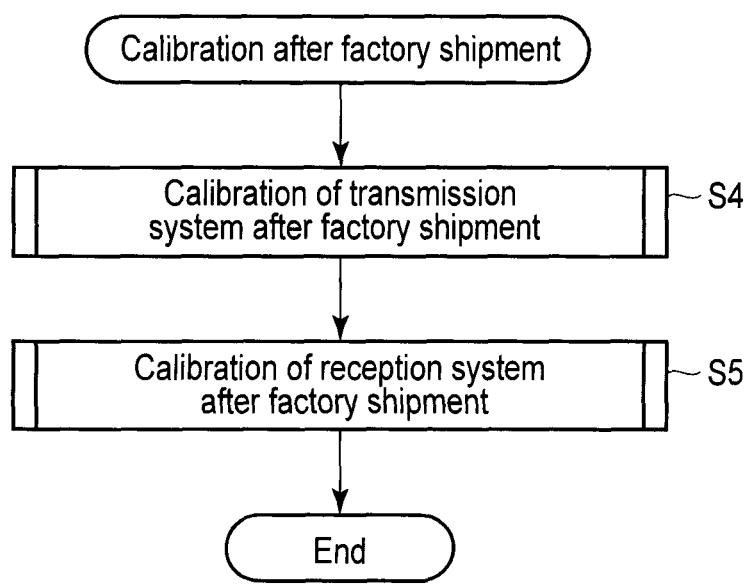
FIG. 10 is a main flowchart of calibration performed on the testing device of the embodiment after factory shipment.
Figure 11:
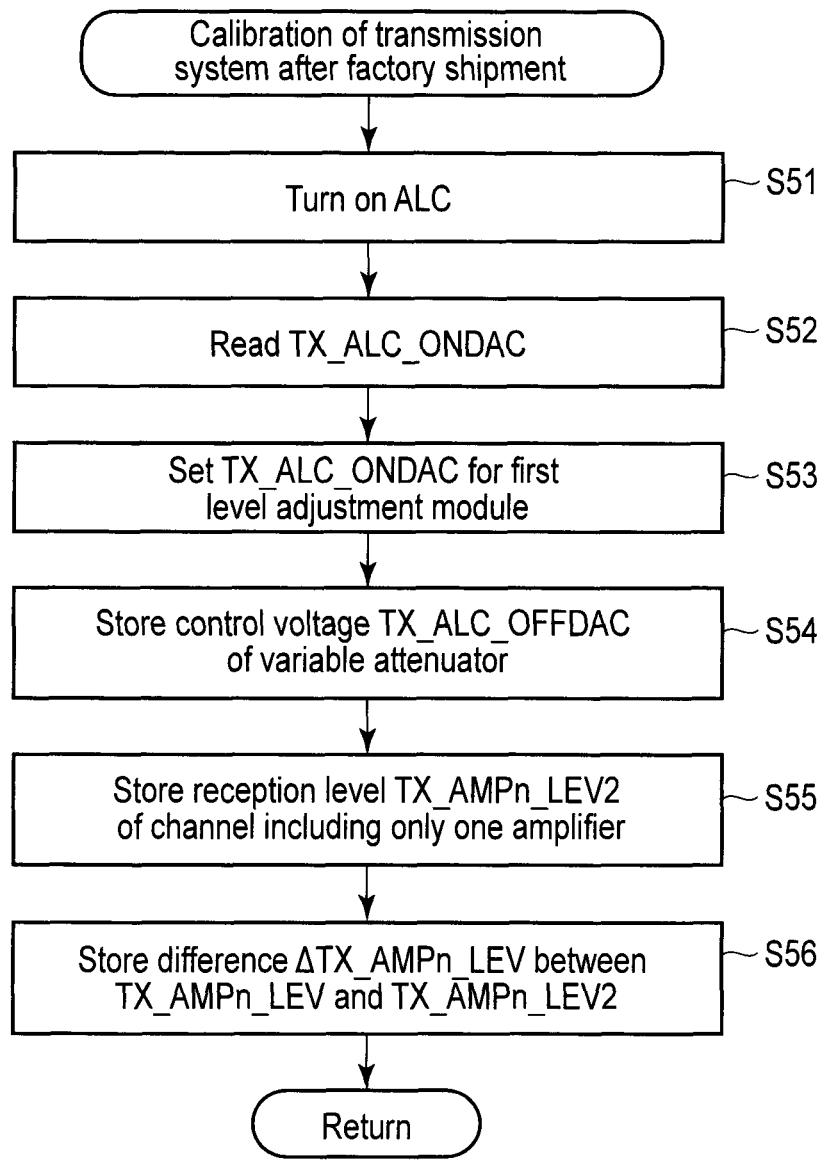
FIG. 11 is a flowchart of calibration performed on the transmission system in the testing device of the embodiment after factory shipment.
Figure 13:
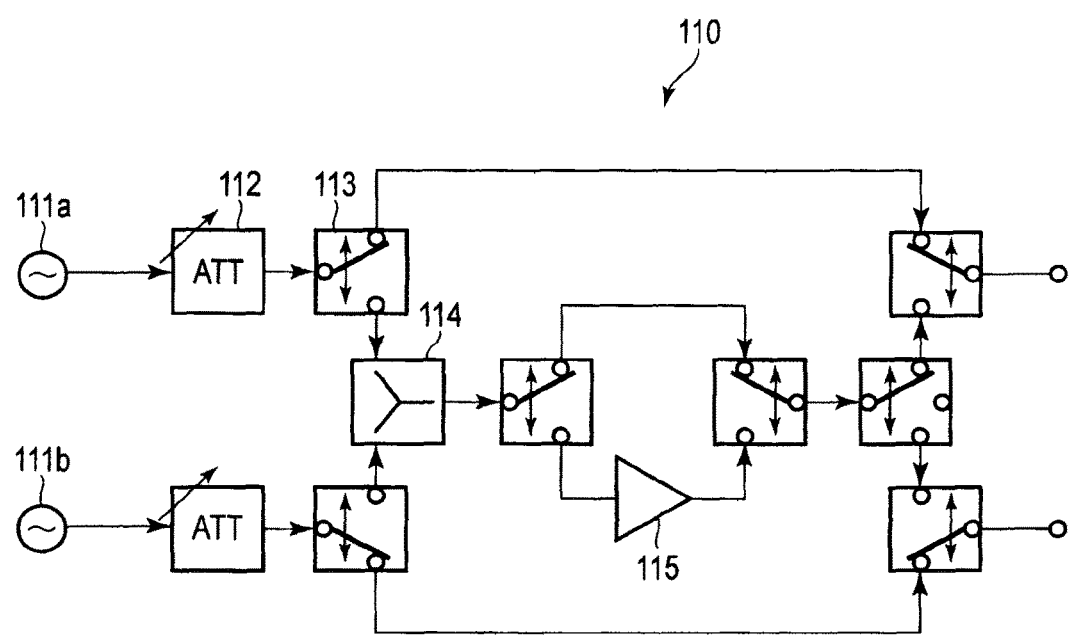
FIG. 13 is a block diagram showing a conventional interface module that comprises two signal generators.
Figure 14:
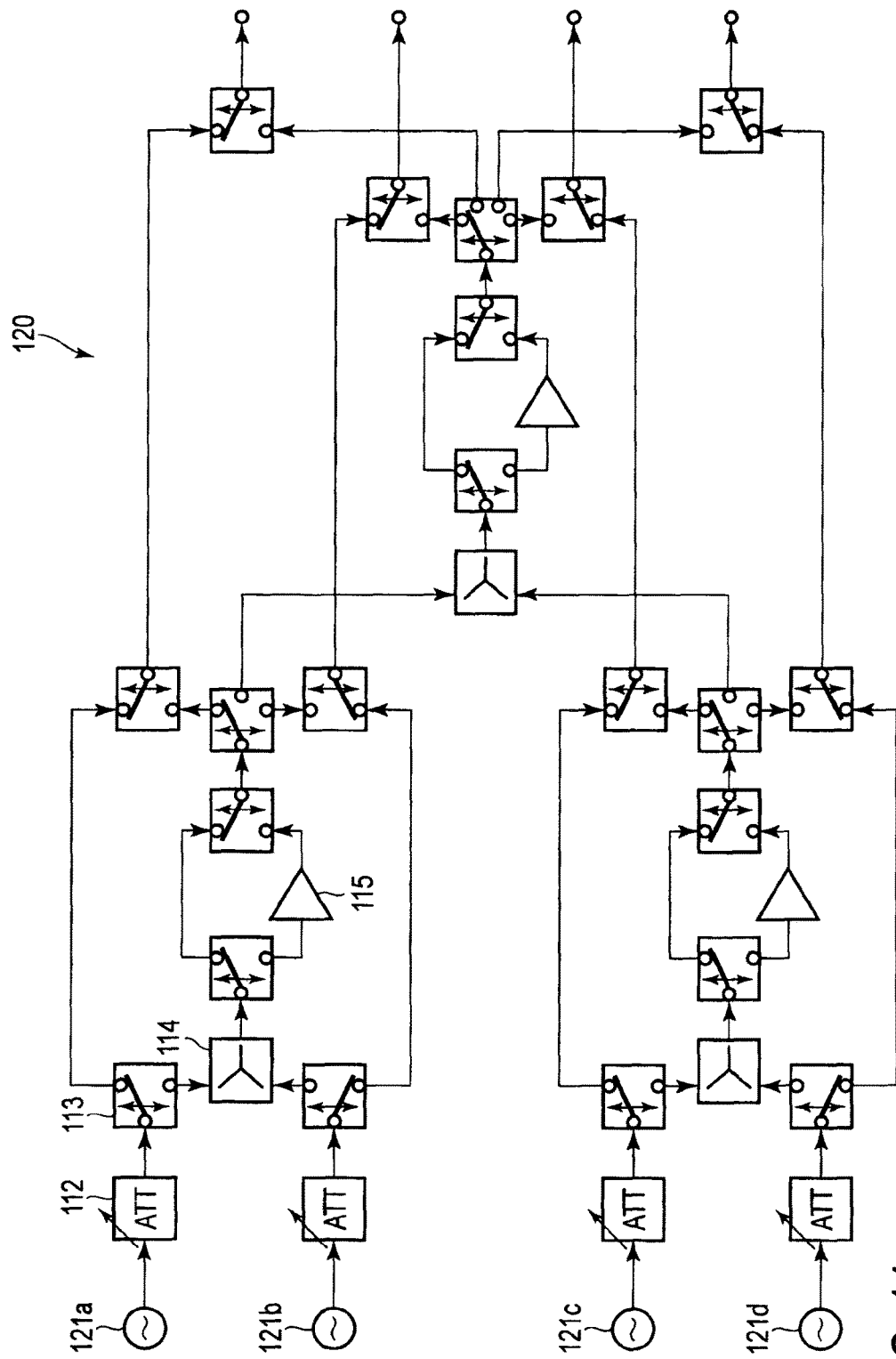
FIG. 14 is a block diagram showing a conventional interface module that comprises four signal generators.
Figure 15:
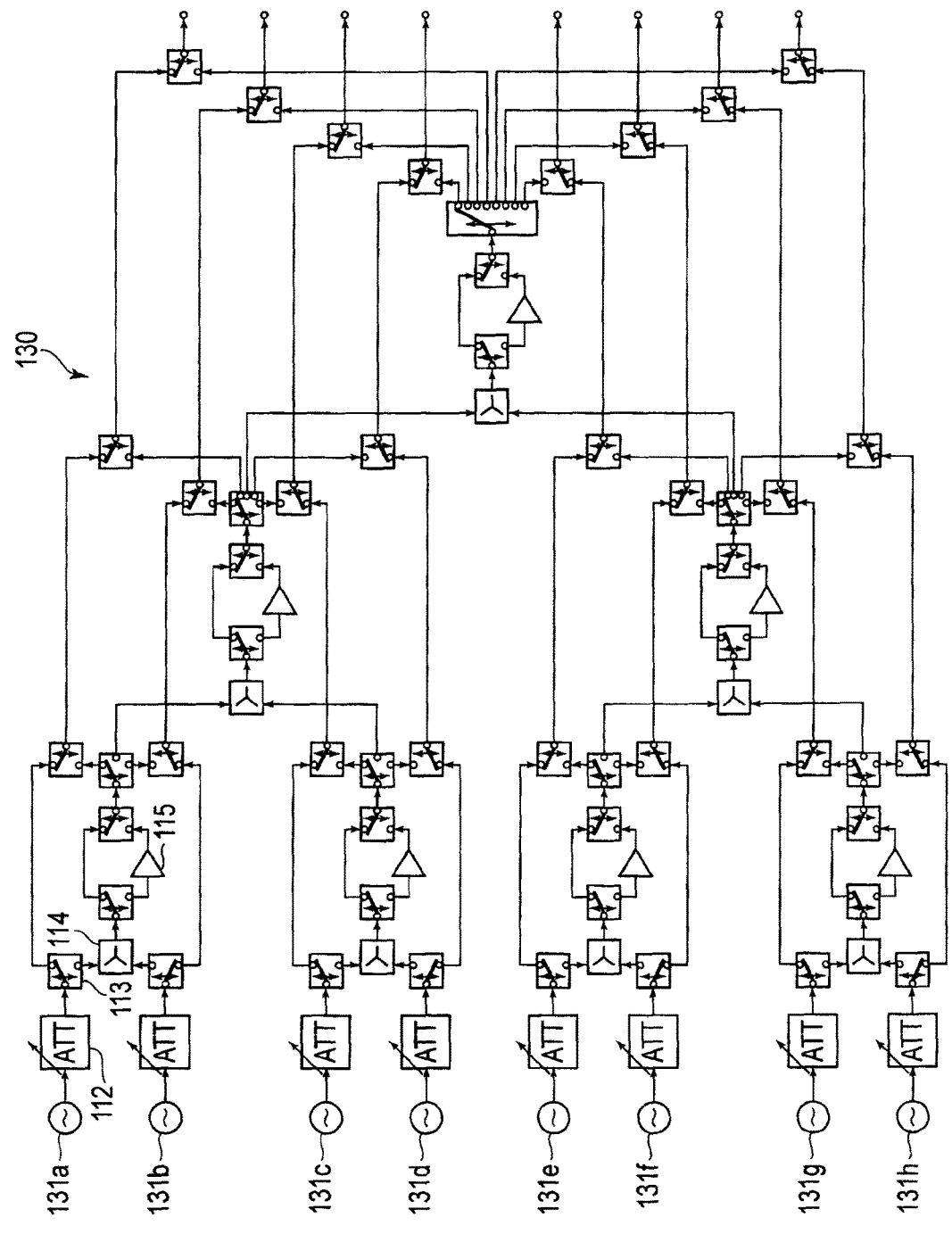
FIG. 15 is a block diagram showing a conventional interface module that comprises eight signal generators.

Referring then to FIGS. 10 to 12, a description will be given of calibration performed on the testing device after factory shipment.

FIG. 10 is a main flowchart of calibration performed on the testing device 1 after factory shipment. As shown in FIG. 10, the testing device 1 performs calibration after factory shipment on the transmission system (step S4), and calibration after factory shipment on the receiving system (step S5).

[Calibration of Transmission System After Factory Shipment]

FIG. 11 is a flowchart of calibration performed on the transmission system after factory shipment in step S4 of FIG. 10. In an initial state, the transmission LB switching module 21 is connected to the transmission FE module 30, the transmission FELB switching module 31 is connected to the transmission switching module 32, and the transmission switching module 32 is connected to the output terminals 37.

The output adjustment module 6b of the control module 6 sets the switching module 209 to select contact 209a to thereby set the ALC-on-state (step S51).

The output adjustment module 6b reads a set value (TX_ALC_ONDAC) from the storage module 4 (step S52).

The output adjustment module 6b sets the read value (TX_ALC_ONDAC) for the first level-adjustment module 206 (step S53).

The control level monitor 210 reads a control level for the variable attenuator 203, and outputs the control level to the output adjustment module 6b. The output adjustment module 6b stores the read control level (TX_ALC_OFFDAC) for the variable attenuator 203 in the storage module 4 (step S54). As a result, level fluctuation in the output terminals 211 of each signal generator 20 due to aging or fluctuation in temperature can be corrected (calibrated) to thereby obtain substantially the same signal level as obtained at factory shipment.

The signal reception module 23 sequentially measures the reception level (TX_AMPn_LEV2) of each of amplifier channels each including only one amplifier 305. The output adjustment module 6b stores the measured reception levels (TX_AMPn_LEV2) in the storage module 4 (step S55).

The correction value calculator 6a of the control module 6 reads the reception level (TX_AMPn_LEV) and the reception level (TX_AMPn_LEV2) from the storage module 4, calculates the difference (ΔTX_AMPn_LEV) therebetween, and stores the difference in the storage module 4 (step S56). This difference serves as a correction value, and enables level fluctuation in the amplifiers of the transmission FE module 30 due to aging or changes in temperature to be corrected (calibrated). As a result, substantially the same signal level as that obtained at factory shipment can be obtained.

[Calibration of Receiving System After Factory Shipment]

FIG. 12 is a flowchart of calibration performed on the receiving system after factory shipment in step S5 of FIG. 10. In an initial state, the reception LB switching module 22 is connected to the reception FE module 35, the reception FELB switching module 34 is connected to the reception switching module 33, and the reception switching module 33 is connected to the input terminals 38.

The control module 6 causes the switching module 209 to select contact 209a to thereby set the ALC-on-state (step S61).

The control module 6 switches each SW included in the transmission LB switching module 21 and the reception LB switching module 22, thereby setting second loopback channels 2a so that the output side of the transmission LB switching module 21 will be the reception LB switching module 22, and the input side of the reception LB switching module 22 will be the transmission LB switching module 21 (step S62).

The signal reception module 23 measures a reception level (RX_ALC_LEV2) in the above channel structure. The control module 6 stores the reception level (RX_ALC_LEV2) in the storage module 4 (step S63).

The correction value calculator 6a of the control module 6 reads the reception level (RX_ALC_LEV) and the reception level (RX_ALC_LEV2) from the storage module 4, calculates the difference (ΔRX_ALC_LEV) therebetween, and stores the same in the storage module (step S64). This difference serves as a correction value, and enables the level fluctuation of the signal reception module 23 due to aging or changes in temperature to be corrected (calibrated). As a result, substantially the same signal level as at factory shipment can be obtained.

The control module 6 cancels the setting of second loopback channels 2a, and sets first loopback channels 3a (step S65). Namely, the control module 6 cancels the setting of second loopback channels 2a by switching each SW, included in the transmission LB switching module 21 and the reception LB switching module 22, so that the output side of the transmission LB switching module 21 will be the transmission FE module 30, and the input side of the reception LB switching module 22 will be the reception FE module 35. Further, the control module 6 sets first loopback channels 3a by switching each SW, included in the transmission FELB switching module 31 and the reception FELB switching module 34, so that the output side of the transmission FELB switching module 31 will be the reception FELB switching module 34, and the input side of the reception FELB switching module 34 will be the transmission FELB switching module 31.

The signal reception module 23 sequentially measures the reception level (RX_AMPn_LEV2) of each amplifier channel that includes only one amplifier 353. The control module 6 stores the reception level (RX_AMPn_LEV2) in the storage module 4 (step S66).

The correction value calculator 6a of the control module 6 reads the reception level (RX_AMPn_LEV) and the reception level (RX_AMPn_LEV2) from the storage module 4, calculates the difference (ΔRX_AMPn_LEV) therebetween, and stores the difference in the storage module 4 (step S67). This difference serves as a correction value, and enables level fluctuation in the amplifiers of the reception FE module 35 due to aging or changes in temperature to be corrected (calibrated). As a result, substantially the same signal level as that obtained at factory shipment can be obtained.

[Correction Values for Transmission and Reception Systems]

The testing device 1 performs testing using the correction values obtained at the above-mentioned calibrations. The correction values for the transmission and reception systems will now be summarized.

[Correction Values for Transmission System]

In the description below, SPX represents output of signals to the DUT 11 through the output terminals 37, and DPX represents output of signals to the DUT 11 through the input/output terminals 39.

A correction value CMP for an SPX non-amplifier channel (a non-amplifier channel in the transmission FE module 30) as a standard channel of calibration is given by $$CMP = TX\_ALC\_OFFDAC \quad (1)$$

A correction value CMP for an SPX synthesizer channel (a non-amplifier channel in the transmission FE module 30) is given by $$CMP = TX\_ALC\_OFFDAC + OFFDAC\_TABLE \\ (TX\_ALC\_OFFDAC, \Delta TX\_FELBx\_LEV) \quad (2)$$

A correction value CMP for a channel obtained by combining the SPX synthesizer channel and an amplifier channel is given by $$CMP=TX\_ALC\_OFFDAC+OFFDAC\_TABLE\\(TX\_ALC\_OFFDAC, \Delta LEV) \quad (3)$$

where $\Delta LEV=\Delta TX\_FELBx\_LEV+\Delta TX\_AMPn\_LEV$

A correction value CMP for a DPX non-amplifier channel (a non-amplifier channel in the transmission FE module 30) is given by $$CMP=TX\_ALC\_OFFDAC+OFFDAC\_TABLE\\(TX\_ALC\_OFFDAC, \Delta TX\_SPX\_DPX) \quad (4)$$

A correction value CMP for a DPX synthesizer channel (a non-amplifier channel in the transmission FE module 30) is given by $$CMP=TX\_ALC\_OFFDAC+OFFDAC\_TABLE\\(TX\_ALC\_OFFDAC, \Delta LEV) \quad (5)$$

where $\Delta LEV=\Delta TX\_FELBx\_LEV+\Delta TX\_SPX\_DPX\_DPX$

A correction value CMP for a channel obtained by combining the DPX synthesizer channel and an amplifier channel is given by $$CMP=TX\_ALC\_OFFDAC+OFFDAC\_TABLE\\(TX\_ALC\_OFFDAC, \Delta LEV) \quad (6)$$

where $\Delta LEV=\Delta TX\_FELBx\_LEV+\Delta TX\_AMPn\_LEV+\Delta TX\_SPX\_DPX$

[Correction Value for Receiving System]

In the described below, SPX represents reception of signals from the DUT 11 through the input terminals 38, and DPX represents reception of signals from the DUT 11 through the input/output terminals 39.

Firstly, each correction value for the reception system will be defined as follows:

Correction value [dBFS]=measured reference level [dBFS]+measured-value difference [dBFS] due to aging/temperature-fluctuation+measured-value difference [dBFS] between channels (7)

A correction value CMP for an SPX non-amplifier channel (a non-amplifier channel in the reception FE module 35) is given by $$CMP=RX\_BASE\_LEV\_SPX+RX\_ALC\_LEV-RX\_ALC\_LEV2 \quad (8)$$

A correction value CMP for an SPX distributing channel (a non-amplifier channel in the reception FE module 35) is given by $$CMP=RX\_BASE\_LEV\_SPX+RX\_ALC\_LEV-RX\_ALC\_LEV2+\Delta RX\_FELBx\_LEV \quad (9)$$

A correction value CMP for a channel obtained by combining the SPX distributing channel and an amplifier channel is given by $$CMP=RX\_BASE\_LEV\_SPX+RX\_ALC\_LEV-RX\_ALC\_LEV2+\Delta RX\_FELBx\_LEV+\Delta RX\_AMPn\_LEV \quad (10)$$

A correction value CMP for a DPX non-amplifier channel (a non-amplifier channel in the reception FE module 35) is given by $$CMP=RX\_BASE\_LEV\_DPX+RX\_ALC\_LEV-RX\_ALC\_LEV2 \quad (11)$$

A correction value CMP for a DPX distributing channel (a non-amplifier channel in the reception FE module 35) is given by $$CMP=RX\_BASE\_LEV\_DPX+RX\_ALC\_LEV-RX\_ALC\_LEV2+\Delta RX\_FELBx\_LEV \quad (12)$$

A correction value CMP for a channel obtained by combining a DPX synthesizer channel and an amplifier channel is given by $$CMP=RX\_BASE\_LEV\_SPX+RX\_ALC\_LEV-RX\_ALC\_LEV2+\Delta Rx\_FELBx\_LEV+\Delta RX\_AMPn\_LEV \quad (13)$$

As described above, in the testing device 1 of the embodiment, a correction value for calibrating loss of each channel included in the transmission FE module 30 is calculated in a calibration-level output state, based on a signal level received by the signal reception module 23 via a corresponding one of first loopback channels 3a, whereby the time required for calibration can be shortened.

Although in the embodiment, the difference in level between a channel including only one amplifier and a non-amplifier channel is calculated and used as a correction value in steps S19, S38, S55 and S66, the invention is not limited to this. For example, if a high level accuracy is not required of the testing device 1, the above-mentioned procedure for shortening the time required for calibration can be simplified by averaging differences in characteristics between channels each including a larger number of amplifiers (in the channel structure of FIG. 4, channels each including three amplifiers), thereby obtaining a correction value.

As described above, the testing device and its calibration method according to the embodiment have an advantage that the calibration time can be shortened, and are useful as a testing device for testing electrical characteristics of a portable device, and a calibration method for use therein.

The testing device of the embodiment can be expressed as follows:

A testing device comprising:

a signal generator (20) configured to generate a first signal output to a device under test (11);

an output module (37) connected to the device under test (11);

a channel selection module (30) provided between the signal generator (20) and the output module (30), and configured to select, between input/output terminals, either one or more amplifier channels (30a, 30b) including an amplifier (305) for amplifying the first signal, or one or more non-amplifier channel (30c) including the amplifier (305);

an input module (38) configured to input a second signal supplied from the device under test (11);

a signal reception module (23) configured to receive the second signal;

an output-side loopback module (31) provided between the channel selection module (30) and the output module (37), and connected to one of a loopback channel (3a) for looping back the first signal to the signal reception module side, and the output module (37); and an input-side loopback module (34) provided between the signal reception module (23) and the input module (38) and connected to one of the loopback channel and the input module (38); and a correction value calculator (6a) configured to calculate a correction value for calibrating loss of a respective one of the channels included in the channel selection module (30), based on a signal level received by the signal reception module (23) via the loopback channel, when the channel selection module (30) selects the non-amplifier channel, and when a calibration-level output state indicating a state where a signal level, at the output module (37), of the first signal generated by the signal generator (20) reaches a predetermined transmission reference level of calibration is assumed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A testing device comprising:
a signal generator configured to generate a first signal output to a device under test;
an output module connected to the device under test;
a channel selector provided between the signal generator and the output module and configured to select one of a plurality of channels;
an input module configured to input a second signal supplied from the device under test;
a signal receiver configured to receive the second signal;
a correction value calculator configured to calculate a correction value for calibrating loss of a respective one of the plurality of channels;
an output-side loopback module provided between the channel selector and the output module, and connected to one of a loopback channel for looping back the first signal to the signal receiver side, and the output module; and
an input-side loopback module provided between the signal receiver and the input module and connected to one of the loopback channel and the input module, wherein
the channel selector is enabled to select, between the input and output modules, one of at least one amplifier channel including one amplifier for amplifying the first signal, and at least one non-amplifier channel not including an amplifier; and
the correction value calculator calculates a correction value for calibrating loss of a respective one of the plurality of channels, based on a signal level received by the signal receiver via the loopback channel, when the channel selector selects the non-amplifier channel, and in a calibration-level output state indicating a state where a signal level, at the output module, of the first signal generated by the signal generator reaches a predetermined transmission reference level of calibration;
wherein further the signal generator comprises:
a signal generation source configured to generate a signal;
a level variation module configured to vary a level of the signal generated by the signal generation source;
a first output adjustment module configured to output a first control signal to the level variation module in accordance with an output level of the level variation module to cause an output level of the signal generator to reach a predetermined target level;
a second output adjustment module configured to output a second control signal to the first output adjustment module to vary a level of the first control signal; and
a storage module configured to store a level of the second control signal in the calibration-level output state at factory shipment,
wherein after the factory shipment, the second output adjustment module reads the level of the second control signal from the storage module, and sets the read level in the first output adjustment module.

2. A testing device comprising:
a signal generator configured to generate a first signal output to a device under test;
an output module connected to the device under test;
a channel selector provided between the signal generator and the output module and configured to select one of a plurality of channels;
an input module configured to input a second signal supplied from the device under test;
a signal receiver configured to receive the second signal;
a correction value calculator configured to calculate a correction value for calibrating loss of a respective one of the plurality of channels;
an output-side loopback module provided between the channel selector and the output module, and connected to one of a loopback channel for looping back the first signal to the signal receiver side, and the output module; and
an input-side loopback module provided between the signal receiver and the input module and connected to one of the loopback channel and the input module, wherein
the channel selector is enabled to select, between the input and output modules, one of at least one amplifier channel including one amplifier for amplifying the first signal, and at least one non-amplifier channel not including an amplifier; and
the correction value calculator calculates a correction value for calibrating loss of a respective one of the plurality of channels, based on a signal level received by the signal receiver via the loopback channel, when the channel selector selects the non-amplifier channel, and in a calibration-level output state indicating a state where a signal level, at the output module, of the first signal generated by the signal generator reaches a predetermined transmission reference level of calibration;
the testing device further comprising a transmission-side shipment-time signal level storage module, wherein
at factory shipment in the calibration-level output state, the transmission-side shipment-time signal level storage module stores a shipment-time signal level of the signal receiver obtained in a case where the channel selector selects the amplifier channel including one amplifier; and
after the factory shipment in the calibration-level output state, the correction value calculator acquires, as a correction value for calibrating level fluctuation in the amplifier channel including the one amplifier, a difference between the shipment-time signal level and a post-shipment signal level of the signal receiver obtained in a case where the channel selector selects the amplifier channel including the one amplifier.

3. A testing device comprising:
a signal generator configured to generate a first signal output to a device under test;
an output module connected to the device under test;
a channel selector provided between the signal generator and the output module and configured to select one of a plurality of channels;
an input module configured to input a second signal supplied from the device under test;
a signal receiver configured to receive the second signal;

a correction value calculator configured to calculate a correction value for calibrating loss of a respective one of the plurality of channels;
an output-side loopback module provided between the channel selector and the output module, and connected to one of a loopback channel for looping back the first signal to the signal receiver side, and the output module; and
an input-side loopback module provided between the signal receiver and the input module and connected to one of the loopback channel and the input module, wherein
the channel selector is enabled to select, between the input and output modules, one of at least one amplifier channel including one amplifier for amplifying the first signal, and at least one non-amplifier channel not including an amplifier; and
the correction value calculator calculates a correction value for calibrating loss of a respective one of the plurality of channels, based on a signal level received by the signal receiver via the loopback channel, when the channel selector selects the non-amplifier channel, and in a calibration-level output state indicating a state where a signal level, at the output module, of the first signal generated by the signal generator reaches a predetermined transmission reference level of calibration;
wherein the channel selector is used as a first channel selector,
the testing device further including a second channel selector provided between the signal receiver and the input module and configured to select one of at least one amplifier channel including one amplifier for amplifying the second signal in the second channel selector, and at least one non-amplifier channel not including an amplifier in the second channel selector,
wherein in the calibration-level output state, the second channel selector selects the at least one non-amplifier channel in the second channel selector, and the correction value calculator calculates the correction value for calibrating the loss of a respective one of the channels in the second channel selector, based on a signal level received by the signal receiver via the loopback channel;
wherein the output-side loopback module, the input-side loopback module and the loopback channel are used as a first output-side loopback module, a first input-side loopback module and a first loopback channel, respectively,
the testing device further having:
a second output-side loopback module provided between the signal generator and the first channel selector and connected to one of a second loopback channel for looping back the first signal to the signal receiver side, and the first channel selector;
a second input-side loopback module provided between the signal receiver and the second channel selector and connected to one of the second loopback channel and the second channel selector; and
a storage module,
wherein
at factory shipment in the calibration-level output state, the storage module stores a signal level received by the signal receiver via the second loopback channel, and
after the factory shipment in the calibration-level output state, the correction value calculator acquires, as a correction value for calibrating level fluctuation in the signal generator, a difference between the signal level stored in the storage module and a post-factory-shipment signal level received by the signal receiver via the second loopback channel.

4. A testing device comprising:
a signal generator configured to generate a first signal output to a device under test;
an output module connected to the device under test;
a channel selector provided between the signal generator and the output module and configured to select one of a plurality of channels;
an input module configured to input a second signal supplied from the device under test;
a signal receiver configured to receive the second signal;
a correction value calculator configured to calculate a correction value for calibrating loss of a respective one of the plurality of channels;
an output-side loopback module provided between the channel selector and the output module, and connected to one of a loopback channel for looping back the first signal to the signal receiver side, and the output module; and
an input-side loopback module provided between the signal receiver and the input module and connected to one of the loopback channel and the input module, wherein
the channel selector is enabled to select, between the input and output modules, one of at least one amplifier channel including one amplifier for amplifying the first signal, and at least one non-amplifier channel not including an amplifier; and
the correction value calculator calculates a correction value for calibrating loss of a respective one of the plurality of channels, based on a signal level received by the signal receiver via the loopback channel, when the channel selector selects the non-amplifier channel, and in a calibration-level output state indicating a state where a signal level, at the output module, of the first signal generated by the signal generator reaches a predetermined transmission reference level of calibration;
wherein the channel selector is used as a first channel selector,
the testing device further including a second channel selector provided between the signal receiver and the input module and configured to select one of at least one amplifier channel including one amplifier for amplifying the second signal in the second channel selector, and at least one non-amplifier channel not including an amplifier in the second channel selector,
wherein in the calibration-level output state, the second channel selector selects the at least one non-amplifier channel in the second channel selector, and the correction value calculator calculates the correction value for calibrating the loss of a respective one of the channels in the second channel selector, based on a signal level received by the signal receiver via the loopback channel;
the testing device further including a reception-side shipment-time signal level storage module,
wherein
at factory shipment in the calibration-level output state, the reception-side shipment-time signal level storage module stores a shipment-time signal level of the signal receiver assumed when the second channel selector selects the at least one amplifier channel including one amplifier in the second channel selector; and after the factory shipment in the calibration-level output state, the correction value calculator acquires, as a correction value for calibrating level fluctuation in the at least one amplifier channel including one amplifier in the second channel selector, a difference between a post-factory-shipment signal level obtained in a case where the second channel selector selects the at least one amplifier channel including one amplifier in the second channel selector, and the shipment-time signal level.

* * * * *